United States Patent
Chowdhury et al.

(10) Patent No.: US 9,997,425 B2
(45) Date of Patent: Jun. 12, 2018

(54) LAYERED BENZOCYCLOBUTENE INTERCONNECTED CIRCUIT AND METHOD OF MANUFACTURING SAME

(71) Applicant: UNIVERSITY OF WINDSOR, Windsor (CA)

(72) Inventors: Sazzadur Chowdhury, Windsor (CA); Horst Schmidt, Windsor (CA)

( * ) Notice: Subject to any disclaimer, the term of this patent is extended or adjusted under 35 U.S.C. 154(b) by 0 days. days.

(21) Appl. No.: 15/207,797

(22) Filed: Jul. 12, 2016

(65) Prior Publication Data
US 2017/0018456 A1    Jan. 19, 2017

Related U.S. Application Data

(60) Provisional application No. 62/192,257, filed on Jul. 14, 2015.

(51) Int. Cl.
*H01L 23/00* (2006.01)
*H01L 23/31* (2006.01)

(52) U.S. Cl.
CPC .......... *H01L 23/31* (2013.01); *H01L 23/3121* (2013.01)

(58) Field of Classification Search
CPC ............................ H01L 23/31; H01L 23/3121
USPC ................................................. 438/618, 622
See application file for complete search history.

(56) References Cited

U.S. PATENT DOCUMENTS

| | | | |
|---|---|---|---|
| 6,632,178 B1 | 10/2003 | Fraser | |
| 6,942,750 B2 | 9/2005 | Chou | |
| 7,152,481 B2 | 12/2006 | Wang | |
| 7,545,012 B2 | 6/2009 | Smith et al. | |
| 7,545,075 B2 | 6/2009 | Huang et al. | |
| 7,612,483 B2 | 11/2009 | Degertekin | |
| 7,670,290 B2 | 3/2010 | Hossack et al. | |
| 7,781,238 B2 | 8/2010 | Wodnicki | |
| 7,830,069 B2 | 11/2010 | Lukacs et al. | |
| 7,839,722 B2 | 11/2010 | Wagner et al. | |
| 7,892,176 B2 | 2/2011 | Wodnick et al. | |
| 7,923,795 B2 | 4/2011 | Kobayashi et al. | |

(Continued)

FOREIGN PATENT DOCUMENTS

| | | | |
|---|---|---|---|
| JP | 08330262 | A * | 12/1996 |
| WO | WO2009/001157 | A1 | 12/2008 |
| WO | WO2012/075106 | A1 | 6/2012 |

OTHER PUBLICATIONS

IPRP in respect of International Application No. PCT/CA2013/000937, dated May 5, 2015, University of Windsor.

(Continued)

*Primary Examiner* — Dale E Page
*Assistant Examiner* — Quovaunda V Jefferson

(57) ABSTRACT

An integrated circuit includes stacked benzocyclobutene layers and a circuit geometry comprising conductive electric traces and interconnects on and/or extending through the BCB layers. A first said BCB layer formed and partially cured state. A top surface masked with photoresist, and after exposure, etched selectively form through vias at locations corresponding to conductive interconnects of the circuit geometry associated with said first BCB layer. A further mask coating is applied and after exposure, conductive metal is deposited to infill vias and form the electric traces of the circuit geometry. Subsequent BCB layers are then likewise formed, etched masked and coated in the same manner.

7 Claims, 28 Drawing Sheets

(56) References Cited

U.S. PATENT DOCUMENTS

| | | | |
|---|---|---|---|
| 2004/0111854 A1* | 6/2004 | Kamimura | B09B 5/00 29/403.3 |
| 2006/0199379 A1* | 9/2006 | Yeh | H01L 21/31144 438/638 |
| 2007/0090546 A1* | 4/2007 | Shioga | H01L 21/4846 257/790 |
| 2008/0315331 A1 | 12/2008 | Wodnicki | |
| 2011/0068654 A1 | 3/2011 | Cheng | |
| 2011/0084570 A1 | 4/2011 | Soeda et al. | |
| 2011/0163630 A1 | 7/2011 | Klootwijk et al. | |
| 2011/0309716 A1 | 12/2011 | Jenninger et al. | |
| 2012/0025337 A1 | 2/2012 | Leclair | |
| 2014/0084747 A1 | 3/2014 | Lovera-Prieto et al. | |

OTHER PUBLICATIONS

Design of a MEMS Discretized Hyperbolic Paraboloid Geometry Ultrasonic Sensor Microarray, IEEE Transactions on ultrasonic, ferroelectrics and Frequency Control, vol. 55, No. 6, Jun. 2008.

Capacitive micromachined ultrasonic transducer (CMUT) arrays for medical imaging, Caronil et al., Microelectronics Journal, vol. 37, pp. 770-777, Dec. 13, 2005.

Abbas Syed, "A Non-planar CMUT array for Automotive Blind Spot Detection", University of Windsor, Electronic Theses and Dissertations, Chapters 3.1, 3.2, 4 and 5, 2009.

Meloche et al., "Design of a MEMS Discretized Hyperbolic Paraboloid Geometry Ultrasonic Sensor Microarray", IEEE Transactions on Ultrasonics, Ferroelectrics and Frequency Control, vol. 55, No. 6, Jun. 2008.

Zure et al. "Dynamic Analysis of an SOI based CMUT", IEEE ICIT 2012, Department of Electrical and Computer Engineering , Univeristy of Windsor, the entire document.

\* cited by examiner

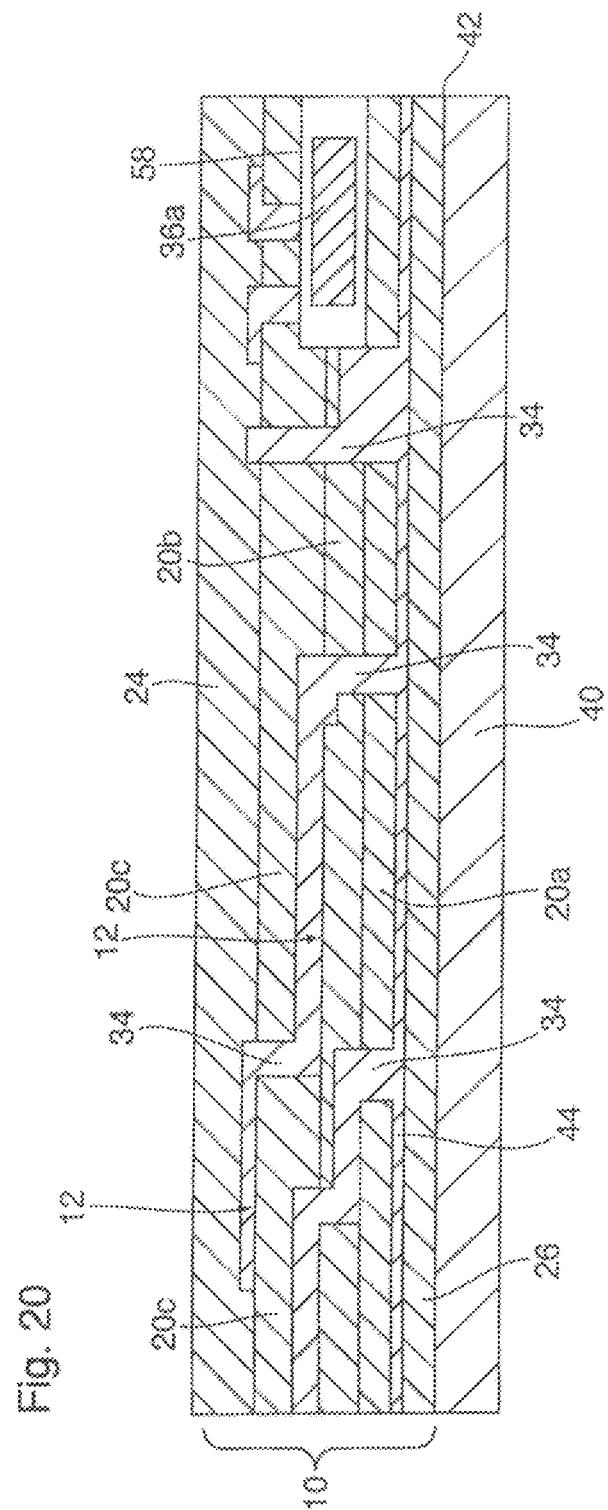

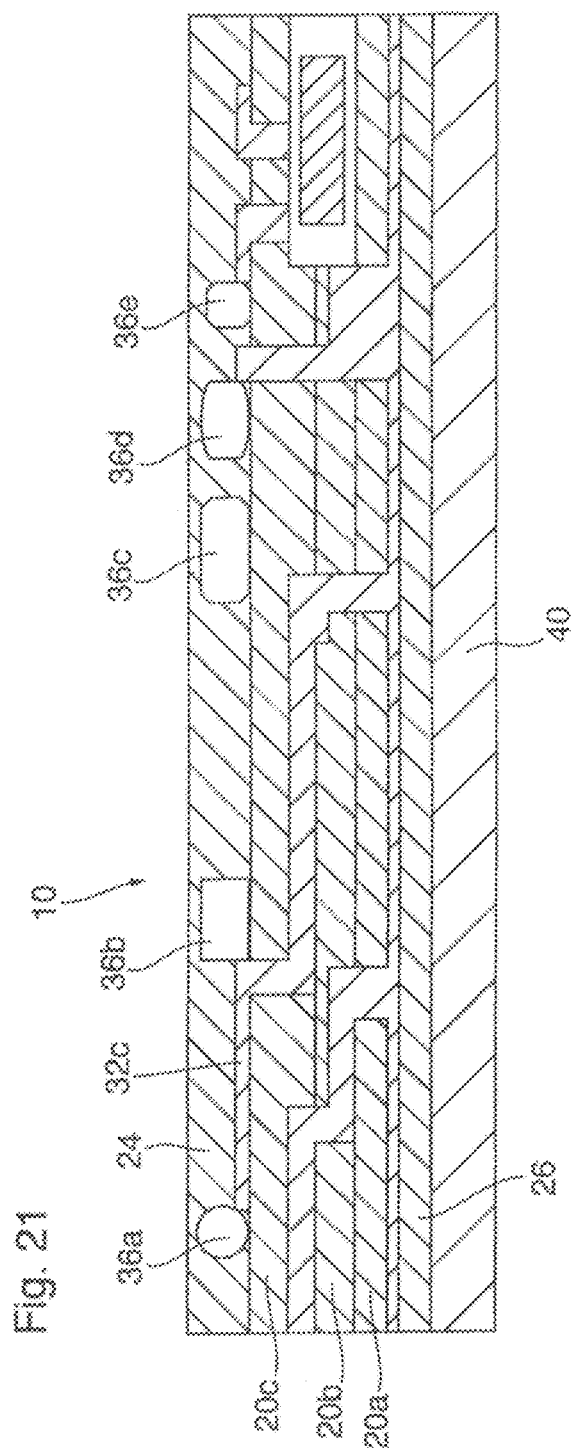

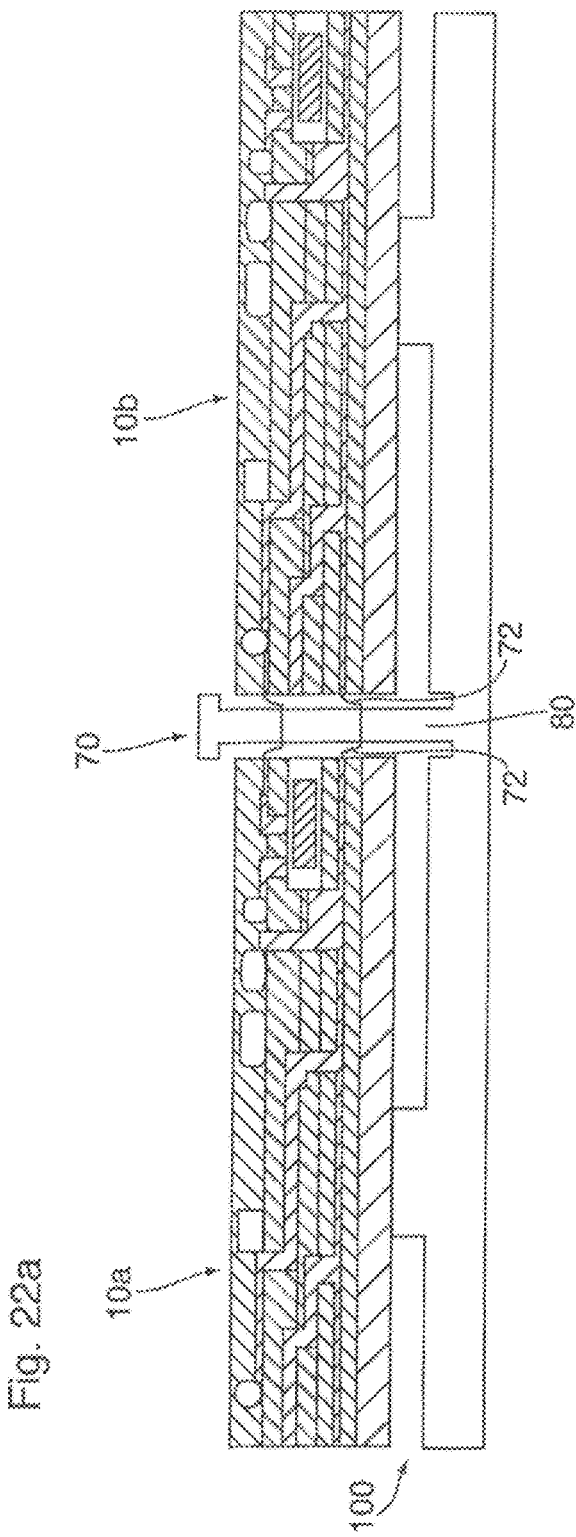

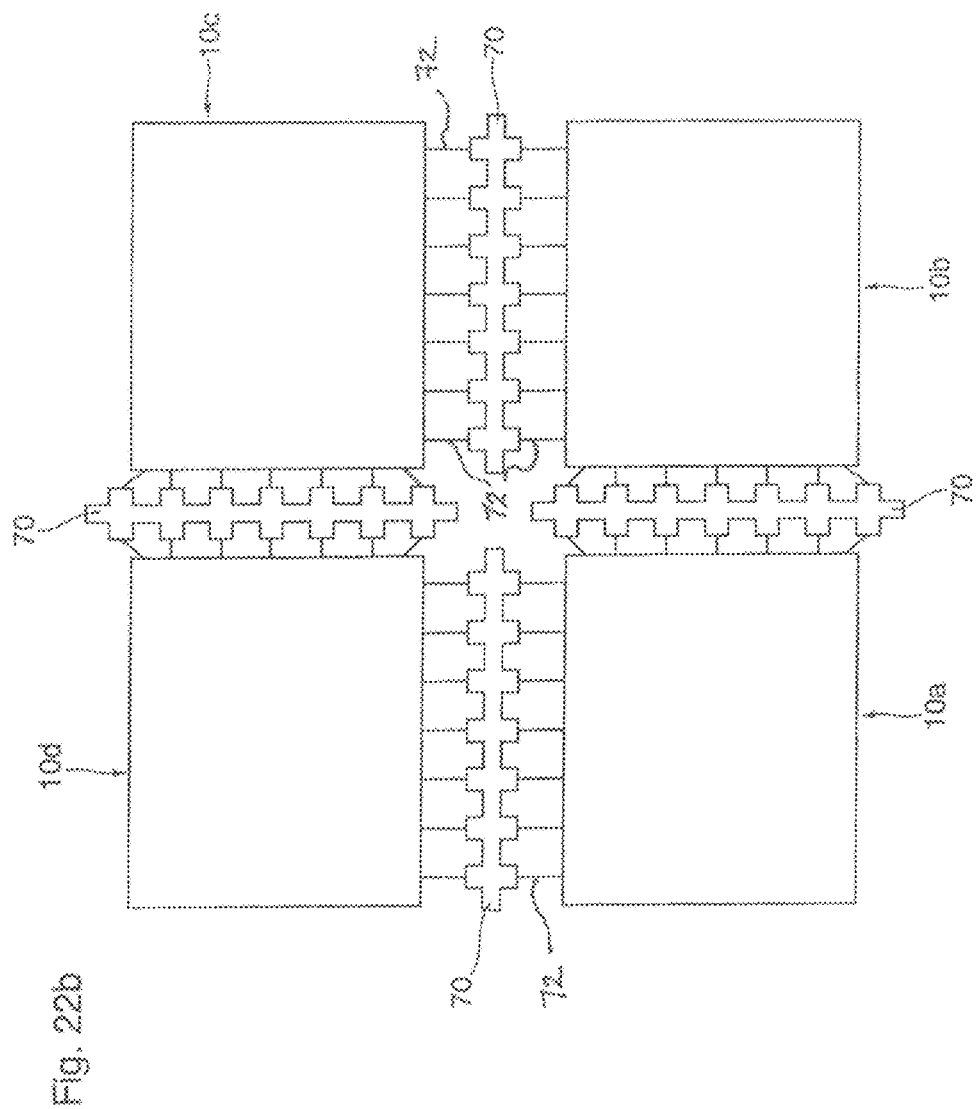

LAYERED BENZOCYCLOBUTENE INTERCONNECTED CIRCUIT AND METHOD OF MANUFACTURING SAME

RELATED APPLICATIONS

This application claims priority and the benefit of 35 USC § 119(e) to U.S. Provisional Application Ser. No. 62/192,257, filed 14 Jul. 2015 the disclosure which is hereby incorporated herein by reference in its entirety.

SCOPE OF THE INVENTION

The present invention relates to a multi-layer construct for use as an integrated circuit and as other electronic components, and more particularly a benzocyclobutene (BCB) based layer construct and method of making same.

BACKGROUND OF THE INVENTION

In the manufacture of integrated circuits and other electronic components, the stacking or vertical positioning of circuit trace wires and electronics such as CPU packages, memory, resistors, and the like is advantageous in both minimizing motherboard space, and reduces conductor track length and routing of interconnections between interoperating parts, thereby achieving faster signal propagation and reduced noise.

Conventionally, when forming stacked or multi-layer circuit constructs such as package on package (PoP) integrated circuits and the like (hereinafter also generally referred to as packages), individual circuit layers are formed by photo-masking and trace printing individual silicon substrates. The substrates of uniform thickness are then vertically aligned and attached, as for example by the selective formation and subsequent infilling of through hole vias and the like.

High density three-dimensional interconnection and packaging technology shows promise in providing interconnection among devices of diverse technological origin, including microelectronic, micro and electro-mechanical, MEMS, NEMS, photonic and microfluidic devices. As well, devices operating functionality by analog, digital, memory, power, acoustical, electromagnetic, optical and/or microfluidic operation have been identified as a critical area of development to meet the emerging requirements of the electronic industry. The 3-D package technology shows promise in realizing high performance memory and MEMS-integrated circuit integration. Conventional packaging technologies may however, be inadequate to meet industry demands of diverse high density low power integration.

To at least partially overcome limitations of the existing multi-chip technologies like MCM-C, MCM-D, and to meet growing high density interconnect demands of the industry, through-silicon-via (TSV) technology (lowest 5 µm diameter, 10 µm pitch) has been developed to enable connection of three-dimensional stacked devices, such as 3-D-IC (stacking of transistors), 3-D-SIC (3-D stacked integrated circuit), and 3-D SOC (3-D System-on-Chip). In conventional via formation, dies are thinned to 20-30 µm, and copper filled interconnects or through-silicon vias (TSV) passing through the wafers are used to achieve connection from one level to another level. Heretofore, wider via pads have proven necessary that limit the interconnection density. As well, thermomechanical reliability problems caused by TSV-induced stress, electronic performance degradation due to strained silicon, and possible device failure due to imperfect TSVs are among the biggest challenges in 3-D integrated circuits.

Fraunhofer IZM recently developed a power embedding packaging technology that seeks to eliminate conventional wire bonding to connect individual integrated circuits with other integrated circuits to realize a system capable of handling high power. However this technology is limited to organic substrates, and necessitates laser drilling of vias in the organic substrates once it encapsulates the die. In addition, as a result of manufacturing limitations, conventional 3D package technologies described above allow only for vertical integration in a single direction only.

SUMMARY OF THE INVENTION

The present invention relates to a three-dimensional electronic circuit construct and its method of manufacture. More particularly, the invention provides in one non-limiting embodiment, a multi-layer electronic circuit construct which for example, may function as an integrated circuit or package, and in which electric traces and electronic components are provided on and/or embedded within layers of benzocyclobutene (BCB) such as Cyclotene™ sold by the Dow Chemical Company. In one non-limiting method of manufacture, individual BCB layers are each deposited, as for example by spin deposition or casting to a required thickness; semi-cured; masked and developed; etched; and then printed with desired traced and/or interconnects. Thereafter a next BCB layer is formed in the stack and the process is repeated, growing the package or circuit layer by layer In one possible non-limiting construction, an integrated BCB (Benzocyclobutene) and MEMS based 3-D microsystem package is provided. The present apparatus and method may achieve high performance interconnection and packaging of a number of differing technological origin components such as dies of silicon, GaAs, SiGe, MEMS, NEMS, photonics, microfluidics, as well as other semiconductors and/or circuits and the like to integrate diverse functionalities in a single package.

One preferred embodiment allows a 3-D package to be manufactured in vertical and/or lateral directions. More preferably, the package enables the 3-D integration of components in multiple directions, whilst providing a robust high reliability package using microfabricated and/or MEMS based interconnection systems. Preferably, the invention provides for a method of constructing a three dimensional BCB-based circuit which allows for the expansion and/or building of the successive circuit layers formed in multiple X, Y and/or Z directions. Most preferably, the BCB circuit may be expanded or both in a lateral X, Y and/or Z directions orientation 90° to the originally vertically stacked or placed Z oriented BCB layers used to form the multi-layer circuit construct.

Preferably, the invention provides for a method of manufacturing and integrating vertically stacked electronics such as integrated circuits, by the successive formation and electric printing of individually placed BCB layers, to achieve a three-dimensional multi-layer circuit construct and encapsulated in BCB.

The present invention may advantageously provide a method of manufacture which optionally may eliminate the need for conventional laser-formed through-silicon-vias (TSV) and/or wirebondings. In another non-limiting embodiment a radio frequency (RF) shield can be created as a part of the package to provide electromagnetic shielding, such as that disclosed in commonly owned U.S. patent application Ser. No. 14/956,751, filed 2 Dec. 2015, the disclosure of which is incorporated herein by reference in its entirety.

The proposed 3D package can be realized using available microfabrication techniques in a cost effective manner. Possible applications of the 3D package include but are not limited to: MEMS ultrasonic transducers, automotive radars, cell phones, airbag systems, pixel and image sensors, cameras, MEMS medical diagnostic cartridge, toys, gaming consoles, memories, processors, prosthetic implants, and other industrial and consumer electronics areas.

Accordingly, the present invention resides in at least the following non-limiting aspects:

1. A method of manufacturing an integrated circuit, said integrated circuit comprising a plurality of benzocyclobutene resin (BCB) layers stacked in an orientation extending in a first direction, and a circuit geometry comprising a plurality of conductive electric traces and one or more conductive interconnects electronically connecting with one or more of said electric traces, and where respective portions of said circuit geometry are provided on and/or extend through part of an associated BCB layer, said method comprising, forming a construct including a first said BCB layer with top and bottom surfaces spaced in said first direction, initially heating said construct for a time selected to partially cure said first BCB layer to a 45% to 75%, and preferably about a 60% fully cured states, with said first BCB layer in the partially cured state, masking said top surface with photoresist coating, and after exposure, etching said first BCB layer to selectively form vias through said first BCB layer at locations corresponding to locations of said conductive interconnects of said respective portion of said circuit geometry associated with said first BCB layer, masking said top surface with a mask coating, and after exposure, depositing conductive metal on said first BCB layer to infill said vias and form the electric traces and conductive interconnects of the respective portions of the circuit geometry associated with said first BCB layer, forming a second said BCB layer on said first BCB layer top surface said second BCB layer including top and bottom surfaces spaced in said first direction, heating said construct for time selected to partially cure said second BCB layer to a 45% to 75%, and preferably about a 60% fully cured state, and with said second BCB layer in the partially cured states, masking said top surface with a first photoresist coating, and after exposure, etching said second BCB layer to selectively form vias through said second BCB layer at locations correspond to locations of said conductive interconnects of said respective portion of said circuit geometry associated with said second BCB layer, forming a second said BCB layer on said first BCB layer top surface, said second BCB layer including top and bottom surfaces spaced in said first direction, heating said construct for time selected to partially cure said second BCB layer to a 45% to 75%, and preferably about a 60% fully cured state, and with said BCB layer in the partially cured state, masking said top surface with a mask coating, and after exposure, depositing conductive metal on said second BCB layer to infill said vias and form the electric traces and conductive interconnects of the respective portion of the circuit geometry associated with said second BCB layer.

2. A method of manufacturing an integrated circuit, said integrated circuit including a first array comprising a plurality of benzocyclobutene resin (BCB) layers stacked in a first direction, and a circuit geometry comprising a plurality of conductive electric traces and electrically conductive interconnects, and where respective portions of said circuit geometry are provided on and/or extend through part of an associated said BCB layer, said method comprising, forming a construct by depositing a first said BCB layer on a base, said first BCB layer including top and bottom surfaces spaced in said first direction, initially heating said construct time selected to partially cure said first BCB layer to a 45% to 75%, and preferably about a 60% fully cured states, and while said first BCB layer is in the partially cured state, selectively forming vias through said first BCB layer at locations of said first BCB layer corresponding to locations of the conductive interconnects of the respective portion of said circuit geometry associated with the first BCB layer, masking said top surface with a mask coating, exposing said masking coating to expose locations of said first BCB layers corresponding to locations of said conductive electric traces and interconnects of the respective portion of the circuit geometry associated with the first BCB layer, and electro-depositing conductive metal on said first BCB layer to infill said vias and form said electric traces and conductive interconnects, successively forming a plurality of further BCB layers over said first BCB layer, each further said further BCB layer including top and bottom surfaces spaced in said first direction and being formed by the steps of: heating said construct for time selected to partially cure said BCB layer to a 45% to 75%, and preferably about a 60% fully cured state, and while the further BCB layer remains in the partially cured state; selectively forming vias through said further BCB layer at locations correspond to locations of said conductive interconnects of the respective portion of said circuit geometry associated with the further BCB layer; and masking said top surface with a mask coating, and after exposure, electro-depositing conductive metal on the further BCB layer to infill the vias and form the electric traces and conductive interconnects of the respective portion of said circuit geometry associated with the further BCB layer.

A method and/or construct in accordance with any of the preceding or hereafter described aspects, further comprising successively forming at least one, and preferably at least two, further said BCB layers on top of second BCB layer, each said further BCB layer including top and bottom surfaces spaced in said first direction and formed by steps of: heating said construct for time selected to partially cure said further BCB layer to a 45% to 75%, and preferably about a 60% fully cured state, and while the further BCB layer remains in the partially cured state; masking said top surface with a first photoresist coating, and after exposure, etching said further BCB layer to selectively form vias through said further BCB layer at locations corresponding to locations of said conductive interconnects of the respective portion of said circuit geometry associated with the further BCB layer; and masking said top surface with a second mask coating, and after exposure, depositing conductive metal on said further BCB layer to infill said vias and form the electric traces and conductive interconnects of the respective portion of said circuit geometry associated with the further BCB layer.

A method and/or construct in accordance with any of the preceding or hereafter described aspects, wherein said conductive metal is deposited by electro-deposition or sputtering.

A method and/or construct in accordance with any of the preceding or hereafter described aspects, wherein prior to said step of masking with said first photoresist layer, polishing said top surface of said first BCB layer to a substantially planar surface.

A method and/or construct in accordance with any of the preceding or hereafter described aspects, wherein said polishing comprises electrochemical polishing or mechanically polishing one or more BCB layer top surface.

A method and/or construct in accordance with any of the preceding or hereafter described aspects, wherein said step of initially heating comprises heating said first BCB layer at a temperature selected at between about 50° C. and 100° C., and preferably between about 60° C. and 80° C., for a time selected at between about 0.05 and 10 minutes, preferably 1 to 5 minutes.

A method and/or construct in accordance with any of the preceding or hereafter described aspects, wherein said integrated circuit comprises at least three said stacked BCB layers, and further wherein said step of etching includes: etching said second BCB layer to form a pocket at least partially therein; and positioning an electronic circuit component at least partially in said pocket.

A method and/or construct in accordance with any of the preceding or hereafter described aspects, wherein said first BCB layer is formed by spin deposition having a thickness selected at between about 2 and 500 microns, preferably 3 and 250 microns, and most preferably between about 4 and 50 microns.

A method and/or construct in accordance with any of the preceding or hereafter described aspects, wherein said mask coating comprises a photoresist coating, and said BCB layers are provided in a substantially juxtaposed arrangement.

A method and/or construct in accordance with any of the preceding or hereafter described aspects, wherein the plurality of BCB layers comprise a layer array, said integrated circuit further including a second layer array comprising a plurality of additional BCB layers provided in a stacked orientation extending in a second direction substantially normal to said first direction, said method further comprising: forming a first said additional BCB layer on a side portion of said first layer array; said first additional BCB layer having top and bottom surfaces spaced in a said second direction; heating said construct for time selected to partially cure said first additional BCB layer to 45% to 75%, and preferably about 60% fully cured state, and while said first additional BCB layer is in said partially cured states, masking said top surface with photoresist coating, and after exposure, etching said first additional BCB layer to selectively form vias through said first additional BCB layer at locations corresponding to locations of said conductive interconnects of said respective portion of said circuit geometry associated with said first additional BCB layer; and masking said top surface with a mask coating, and after exposure, depositing conductive metal on said first additional BCB layer to infill said vias and form said electric traces and conductive interconnects of said respective portion of said circuit geometry associated with said first additional BCB layer.

A method and/or construct in accordance with any of the preceding or hereafter described aspects, wherein the respective portion of said circuit geometry associated with first additional BCB layer is selected to electrically communicate with at least part of the respective portion of the circuit geometry associated with at least one said BCB layers of the first layer array.

A method and/or construct in accordance with any of the preceding or hereafter described aspects, wherein forming a second said additional BCB layer on said top of said first additional BCB layer, said second additional BCB layer including top and bottom surfaces spaced in said second direction; heating said construct for time selected to partially cure said second additional BCB layer to a 45% to 75%, and preferably about a 60% fully cured state, and with said second additional BCB layer in the partially cured state; masking said top surface with a first photoresist coating, and after exposure, etching said second additional BCB layer to selectively form vias through said second additional BCB layer at locations correspond to locations of said conductive interconnects of said respective portion of said circuit geometry associated with said second additional BCB layer; and masking said top surface with a second mask coating, and after exposure, depositing conductive metal on said second additional BCB layer to infill said vias and form said electric traces and conductive interconnects of said respective portion of said circuit geometry associated with said second additional BCB layer.

A method and/or construct in accordance with any of the preceding or hereafter described aspects, wherein the step of selectively forming vias comprises drilling or laser forming said vias.

A method and/or construct in accordance with any of the preceding or hereafter described aspects, wherein the vias are formed by the steps of: masking each further BCB layer with a photo-resist coating; selectively etching the further BCB layer to form vias extending from the top surface to the bottom surface; and thereafter, removing the photoresist coating.

A method and/or construct in accordance with any of the preceding or hereafter described aspects, wherein the mask coating is a photoresist coating.

A method and/or construct in accordance with any of the preceding or hereafter described aspects, wherein the plurality of BCB layers comprise a layer array, said integrated circuit further including a second layer array comprising a plurality of additional BCB layers provided in a stacked orientation extending in a second direction oriented in an angular orientation and preferably normal to said first direction, said method further comprising: forming a first said additional BCB layer on a side portion of said first layer array; said first additional BCB layer having top and bottom surfaces spaced in a said second direction; heating said construct for time selected to partially cure said first additional BCB layer to 45% to 75%, and preferably about 60% fully cured state, and while said first additional BCB layer is in said partially cured state, masking said top surface with photoresist coating, and after exposure, etching said first additional BCB layer to selectively form vias through said first additional BCB layer at locations corresponding to locations of said conductive interconnects of said respective portion of said circuit geometry associated with said first additional BCB layer; and masking said top surface with a mask coating, and after exposure, depositing conductive metal on said first additional BCB layer to infill said vias and form said electric traces and conductive interconnects of said respective portion of said circuit geometry associated with said first additional BCB layer.

A method and/or construct in accordance with any of the preceding or hereafter described aspects, wherein the respective portion of said circuit geometry associated with first additional BCB layer is selected to electrically communicate with at least part of the circuit geometry associated with at least one said BCB layers of the first layer array.

A method and/or construct in accordance with any of the preceding or hereafter described aspects, wherein forming a second said additional BCB layer on said top of said first additional BCB layer, said second additional BCB layer including top and bottom surfaces spaced in said second direction; heating said construct for time selected to partially cure said second additional BCB layer to a 45% to 75%, and preferably about a 60% fully cured state, and with said second additional BCB layer in the partially cured state; masking said top surface with a first photoresist coating, and after exposure, etching said second additional BCB layer to selectively form vias through said second additional BCB layer at locations correspond to locations of said conductive interconnects of said respective portion of said circuit geometry associated with said second additional BCB layer; and masking said top surface with a second mask coating, and after exposure, depositing conductive metal on said second additional BCB layer to infill said vias and form said electric traces and conductive interconnects of said respective portion of said circuit geometry associated with said second additional BCB layer.

A method and/or construct in accordance with any of the preceding or hereafter described aspects, wherein said conductive metal is selected from the group consisting of gold and gold alloys.

A method and/or construct in accordance with any of the preceding or hereafter described aspects, wherein prior to said step of forming said vias, polishing said top surface of said first BCB layer to a substantially planar surface.

A method and/or construct in accordance with any of the preceding or hereafter described aspects, wherein said BCB layers are polished by one of electrochemical polishing and mechanical polishing.

A method and/or construct in accordance with any of the preceding or hereafter described aspects, wherein said step of initially heating comprises heating said first BCB layer at a temperature selected at between about 50° C. and 100° C., and preferably between about 60° C. and 80° C., for a time selected at between about 0.05 and 10.0 minutes, and preferably 0.5 to 5 minutes.

A method and/or construct in accordance with any of the preceding or hereafter described aspects, wherein said BCB layers are formed by spin deposition having a thickness selected at between about 2 and 500 microns, preferably 3 and 250 microns, and most preferably between about 4 and 50 microns.

A method and/or construct in accordance with any of the preceding or hereafter described aspects, wherein said mask coating comprises a photoresist coating, and said stacked BCB layers are provided in a substantially directly juxtaposed arrangement.

A construct and/or three-dimensional integrated circuit made by the method of any of the foregoing aspects.

A construct and/or integrated circuit package having an integrated circuit made in accordance with any of the foregoing aspects.

A construct and/or an integrated circuit package comprising a plurality of the three-dimensional integrated circuits made in accordance with any of the aforementioned aspects, and further comprising a spring connector electrically connecting the circuit geometry of at least two adjacent ones of said plurality of integrated circuits.

BRIEF DESCRIPTION OF THE DRAWINGS

Reference may now be had to the following Figures taken together with the accompanying disclosure, in which:

FIG. 20 illustrates a cross-sectional view of a three-dimensional integrated circuit showing the placement of a thicker top BCB layer of BCB in accordance with an alternate embodiment of the invention;

FIG. 21 shows a cross sectional view of a three dimensional integrated circuit illustrating the placement and embedding electronic components mid-stack in accordance with a further embodiment of the invention;

FIGS. 22a and 22b illustrate respectively, cross-sectional and top views of a BCB-MEMS based 3D package showing the vertical and lateral connections between multiple 3D integrated circuits in accordance with further embodiment of the invention;

DETAILED DESCRIPTION OF THE PREFERRED EMBODIMENTS

Figure 1:
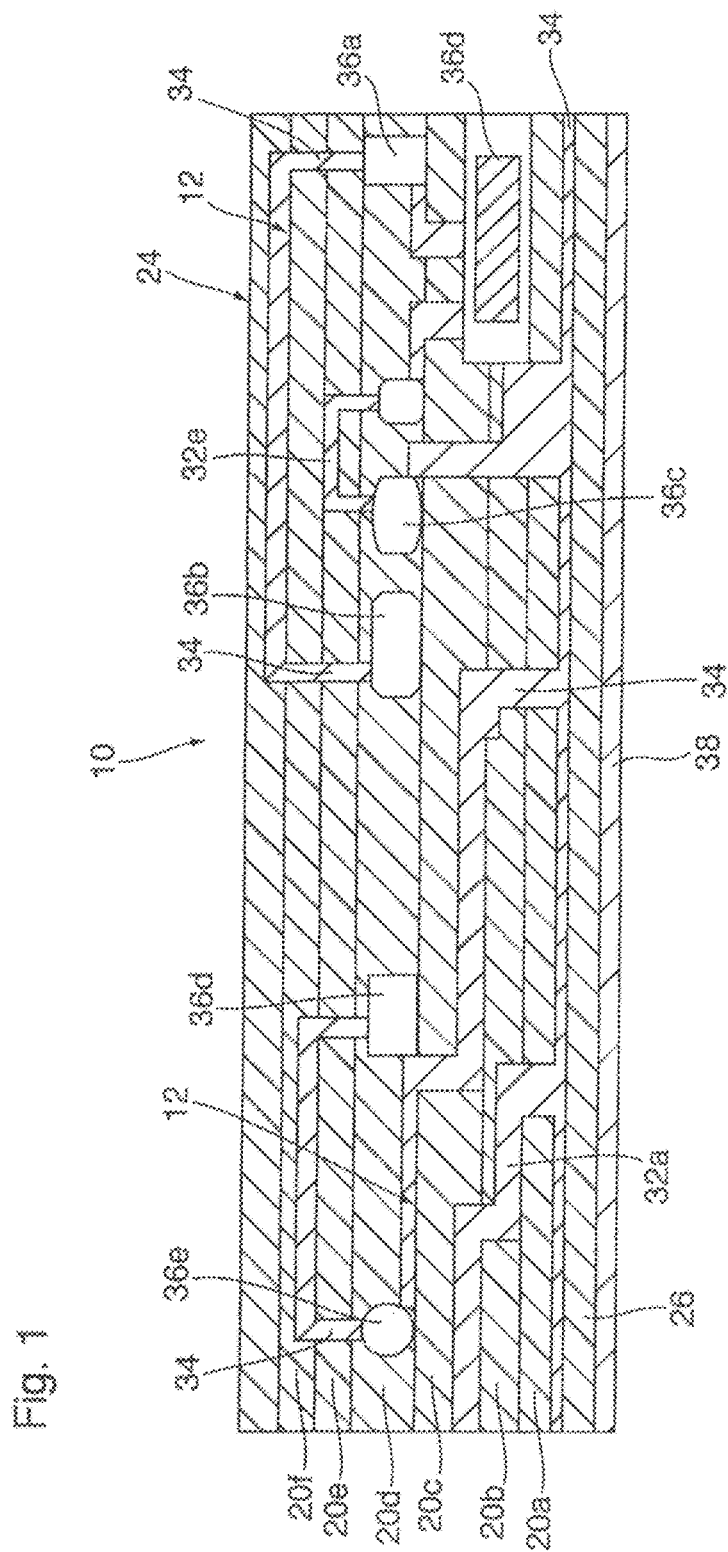
FIG. 1 shows a cross-sectional view of a BCB-based multilayer 3D integrated circuit in accordance with a first preferred embodiment of the invention.

Reference may be had FIG. 1 which illustrates a cross-section side view of three-dimensional package or integrated circuit 10 in accordance with a first embodiment. As will be described, the integrated circuit 10 is provided with a circuit architecture 12 which is vertically stacked in the Z-direction. The integrated circuit 10 includes a series of vertically stacked internal structural layers $20a$, $20b$, $20c$ . . . $20f$ which are formed from benzocyclobutene (BCB), and which is covered along its respective top and bottom surfaces by respective BCB top and bottom layers 24,26.

As shown best in FIG. 1, the vertically stacked circuit architecture 12 is characterized by the selective interconnection of a series of printed conductive metal gold leads or traces $32a$ . . . $32e$ which are formed on the surfaces of one or more associated BCB structural layer $20a$, $20b$, $20c$ . . . $202f$. The gold traces $32a$ . . . $32e$ in turn are connected electrically by vertically conductive vias interconnects 34 which extend vertically through one or more BCB layers $20a$ . . . $20f$.

FIG. 1 further shows the integrated circuit 10 as having internally embedded within the stacked layers 26, $20a$-$e$, 24, integrated circuit components 36. Such components may include without limitation internally positioned transistors $36a$, $36b$, resistors $36c$, amplifiers $36d$ and/or other circuits $36e$ or conductive structures, and which are provided in electronic communication with leads 32 and/or interconnects 34 depending on the desired circuit operation. The conductive traces $32a2$ . . . $32e$ form the circuit architecture 12 lateral or horizontal connections, electrically separated by individual BCB structural layers $20a$, $20b$, $20c$ . . . $20f$. The infilled via interconnects 34 extend vertically through one or more of the BCB structural layers $20a$, $20b$, $20c$ . . . $20f$, provide desired vertical connections. In the context of the present invention, it is to be appreciated that the integrated circuit 10 may incorporate a number of different types of electronic components 36, depending upon the intended application and operation.

Depending upon the circuit design, a gold ground layer 38 may be formed over the bottom layer 26. The ground layer 38 may be provided in indirect electrical communication with the circuit architecture 12, as may be necessary to complete the circuitry. Other ground configurations including direct connection may, however, be provided.

The applicant has appreciated that the use of BCB, such as CYCLOTENE™ sold by Dow Chemical Corporation in the formation of the circuit top, bottom and internal structural layers 24, 26, $20a$ . . . $20f$ allows the integrated circuit 10 to be manufactured in a layer-on-layer built up process. Furthermore, depending upon the application and the specific types of any electronic components 36 which are to be incorporated into the circuit architecture 12, the structural BCB layers $20a$, $20b$, $20c$ . . . $20f$ may be made with varying thicknesses. The final thickness of individual BCB layers $20a$, $20b$, $20c$ . . . $20f$ are chosen to allow selected components $36a$, $36b$, $36c$ . . . to be properly embedded physically within the integrated circuit 10, both protecting the components 36 and minimizing the necessary circuit vertical geometry.

While FIG. 1 illustrates the integrated circuit 10 as having a top BCB layer 24, a bottom BCB layer 26 and six BCB structural layers $20a$, $20b$, $20c$ . . . $20f$, the invention is not so limited. It is to be appreciated that the integrated circuit 10 may be provided with or without layer 24 and/or layer 26, and well as with greater or fewer numbers of BCB structural layers 20, depending upon the overall circuit function.

Further forming BCB structural layers $20a$, $20b$, $20c$ . . . $20f$, as well as circuit top and bottom layers 24,26 from BCB resin allows for the formation of the circuit layers by spin casting. This in turn facilitates the formation of included BCB layers 24, 26, 20 with both substantially flat, stable top layer surfaces as well as predictable thickness, irrespective of the underlying layer topography.

Reference may now be had to FIGS. 2 to 20 which illustrate the process steps of forming a 3D integrated circuit 10 (FIG. 20) which is stacked in a vertical Z-direction in accordance with a further embodiment, and wherein like reference numerals are used to identify like components.

In a preferred method of manufacture, a high finish silicon wafer 40 (FIG. 2) is preferably initially selected as a holder fixture. The silicon wafer 40 is provided with a top-most oxide release layer 42 which, following circuit construction, allows the finished integrated circuit 10 to be easily separated from the wafer 40.

Figure 2:
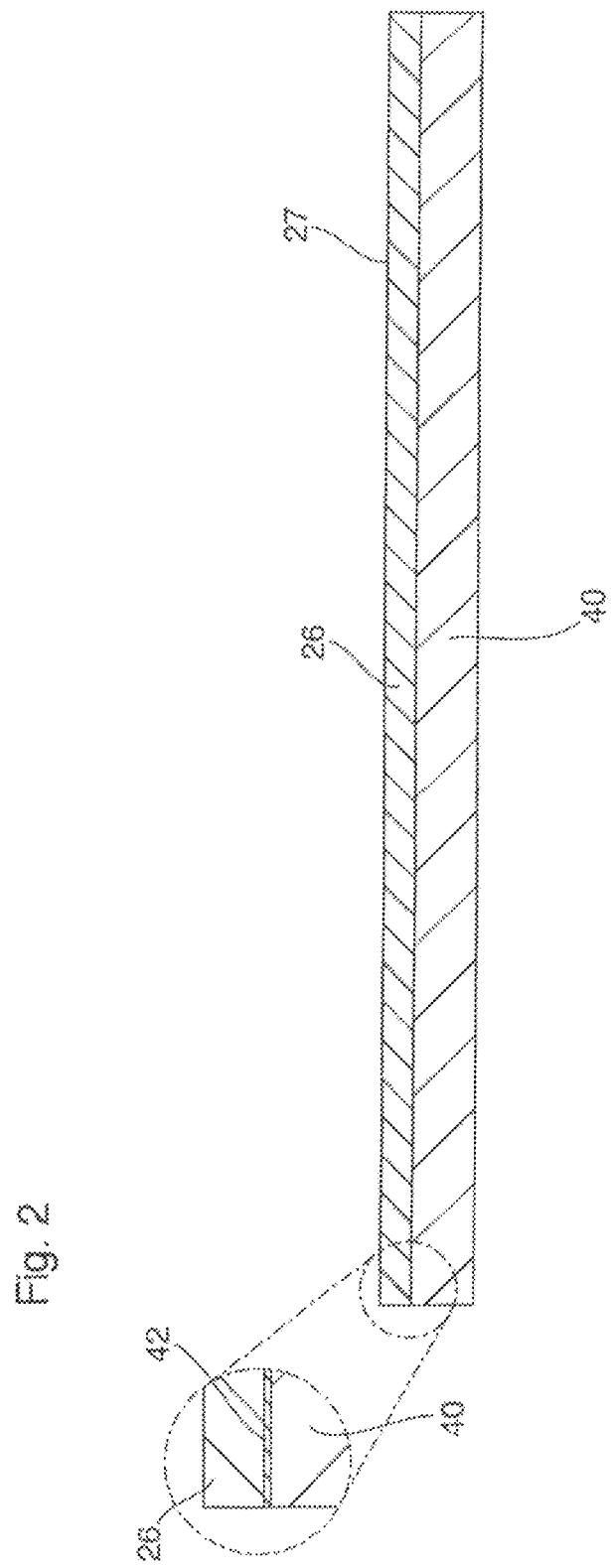
FIG. 2 shows the formation of a BCB base layer on a silicon oxide surface of a silicon support wafer in accordance with a preferred first manufacturing step.

Initially, a first base layer of BCB which is to function as the circuit bottom layer 26 is spin deposited on to the oxide surface 42. The BCB bottom layer 26 is formed to a predetermined thickness, having regard to the desired parameters of the final integrated circuit design 10, and which typically is selected at between about 5 and 500 microns and more preferably between 50 and 200 μm. Once spin deposited, the assembly with the deposited BCB bottom layer 26 is placed in an oven for a sufficient time to effect at least partial, and more preferably full curing of the BCB layer 26. The spin deposition of BCB layer 26 advantageously allows for the more precise control of the formation of the layer 26 with the desired thickness and with a substantially flat upper surface 27 (FIG. 2).

Figure 3:
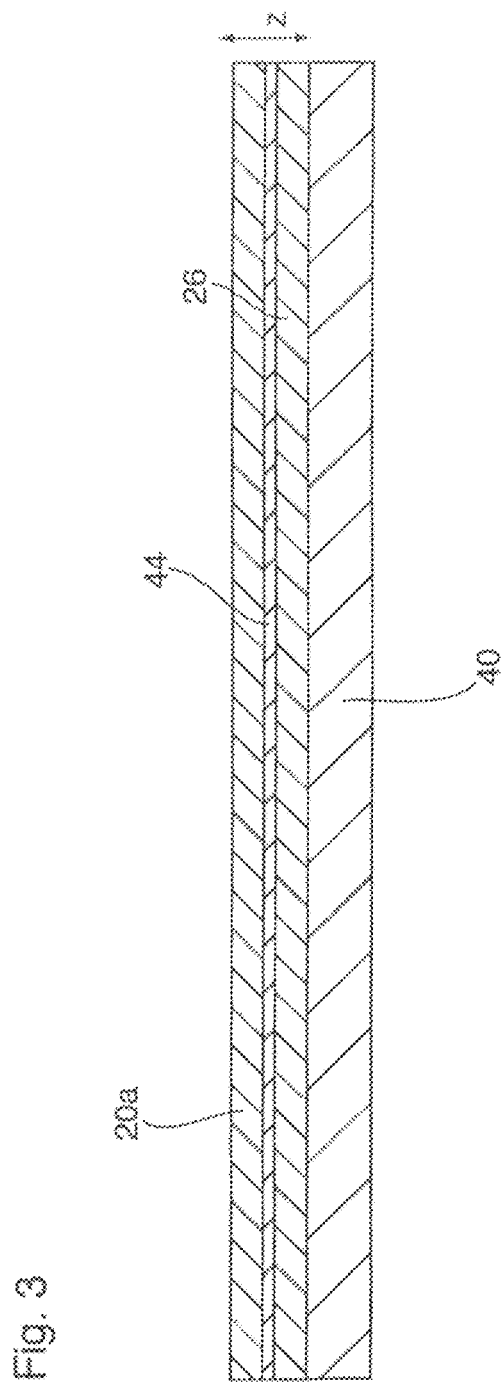
FIG. 3 illustrates schematically the formation of a first gold layer and the next BCB structural layer on the base BCB layer illustrated in FIG. 2.
Figure 4:
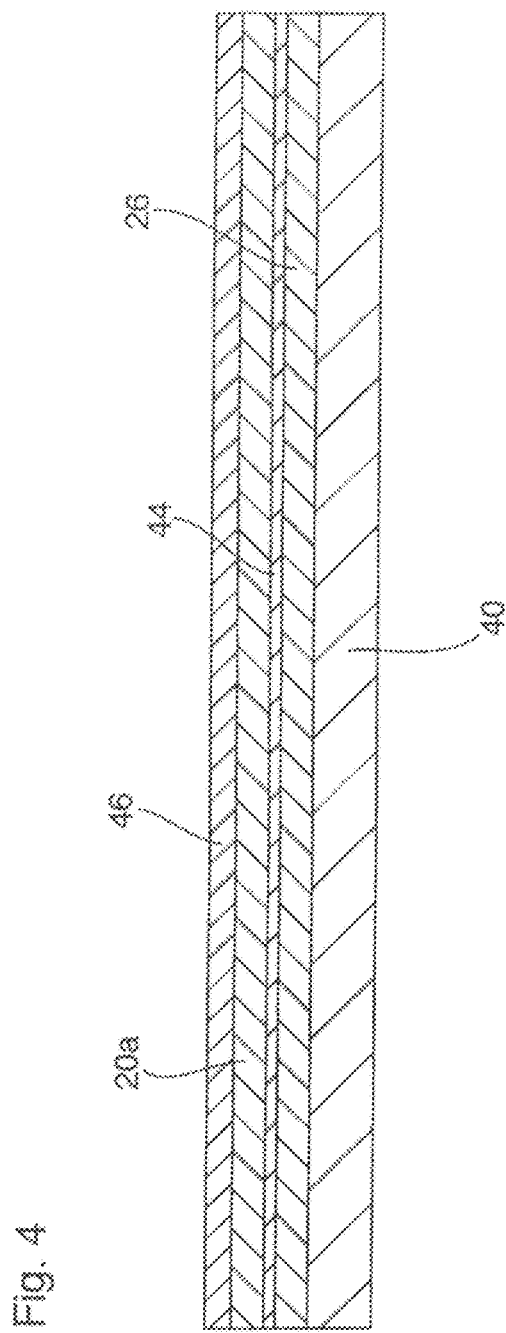
FIGS. 4 and 5 illustrate schematically the application of photoresist layer on the top BCB layer of the assembly shown in FIG. 3, and the subsequent removal of photoresist of formation of vias and other formations through the BCB layer placed in FIG. 3.

As shown in FIG. 3, following the formation of the BCB bottom layer 26, a gold ground layer 44 is optionally formed on the surface 27 of the bottom layer 26. The gold layer 44 is provided as part of the circuit architecture 12 (FIG. 20) and is preferably formed to a desired thickness by sputtering or other suitable deposition process. Depending on the circuit architecture 12, the ground layer 44 typically is provided with a deposition thickness selected at between about 3 and 150 microns, and preferably about 5 and 50 microns.

After formation of the gold layer 44, the first structural BCB layer $20a$ is spin deposited over the gold layer 44. The BCB layer $20a$ may be deposited directly on to the gold layer 44 or optionally and adhesion promoter layer such as AP3000™ sold by Dow Chemical may be preapplied to the gold layer 44 prior to BCB deposition. The final thickness of BCB layer $20a$ will depend upon the functionality of the integrated circuit 10 to be formed, and having regard to the operation of the selected circuit architecture 12. In the typical case, layer $20a$ will have a vertical thickness in the Z direction selected at between about 2 and 250 microns, and preferably 3 and 50 microns. Large or smaller layer thicknesses could however be provided.

After spin deposition of the BCB coating, the assembly is again placed in an oven to achieve the partial curing of the deposited structural BCB layer 20a. The assembly is preferably heated in the oven for a time and temperature to achieve a sufficiently solid workable BCB consistency, preferably to about a 40 to 75% fully cured state, and more preferably about 60% of a fully cured state. Depending upon the final thickness of the layer 20a deposited, typical heating will range between about 1 and 5 at minutes temperatures of between about 55° C. and 100° C.

Figure 5:
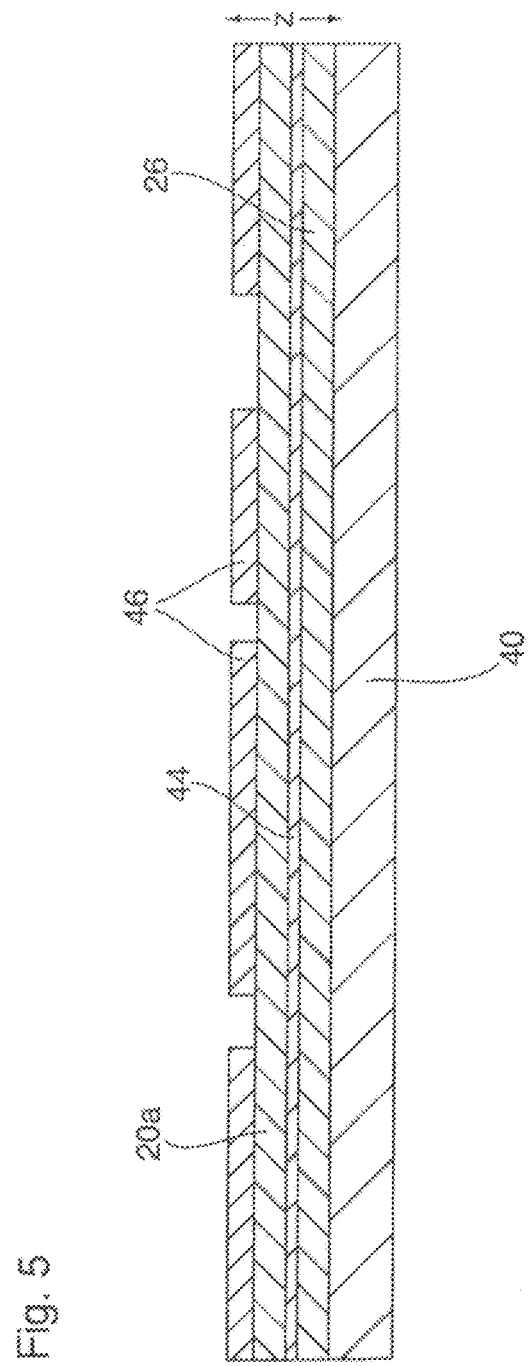

Following partial curing, a photoresist layer 46 (FIG. 4), and most preferably a positive photoresist layer is deposited over the partially cured BCB layer 20a. The photoresist layer 46 is photo printed through a negative mask process in accordance with the chosen design and orientation of the desired circuit architecture 12 to be formed at layer 20a. The mask is then developed to expose the areas of the BCB structural layer 20a to be removed by etching, as shown in FIG. 5. In a preferred method exposure is effected by way of a Super High Power Mercury Lamp, USHIO™ at 456 mJ/cm$^2$, and developing for two minutes in a Microposit MF-319 Developer™ sold by Shipley Company. The assembly is spin washed with deionized water and descumed in O$_2$ plasma for two minutes to expose the underlying portions of the BCB layer 20a to be removed and prepare the construct for etching.

Figure 6:
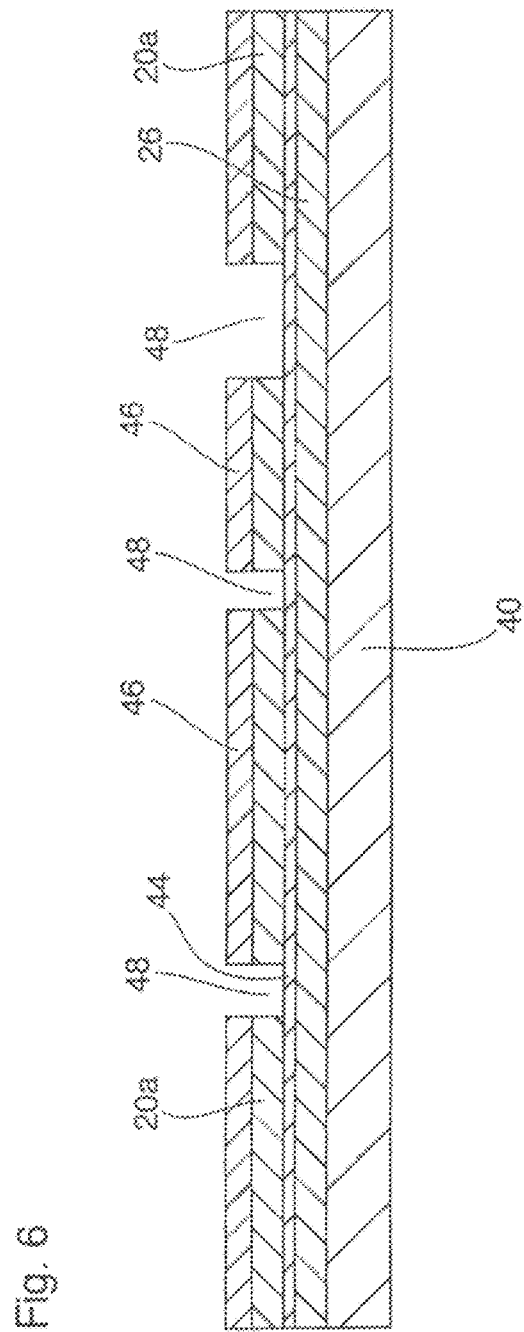
FIGS. 6 and 7 illustrate schematically the selective etching of the assembly of FIG. 5 for the formation of conductive vias, and the removal of the photoresist.

As shown in FIG. 6, the exposed portions of BCB layer 20a are thereafter etched in a vacuum chamber at 50 mTorr and in an atmosphere of oxygen (O$_2$:90 Sccm) and carbon-tetra-fluoride (CF$_4$:22.5) using an RF power of 300 W, providing an etching rate of 295 nm/min. Etching of the BCB structural layer 20a is effected to form desired vertically extending vias 48 through the BCB layer 20a exposing one or more portions of the underlying gold ground layer 44. The vias 48 are formed at position and with dimensions corresponding to the desired final circuit architecture 12 interconnects 34 at layer 20a.

Figure 7:
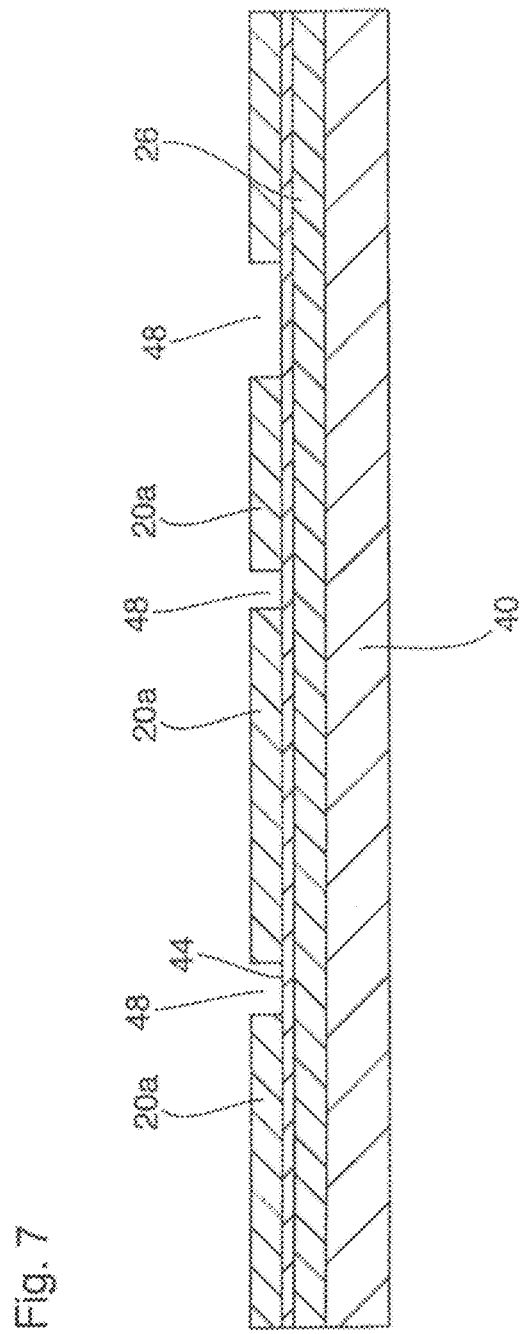
Figure 8:
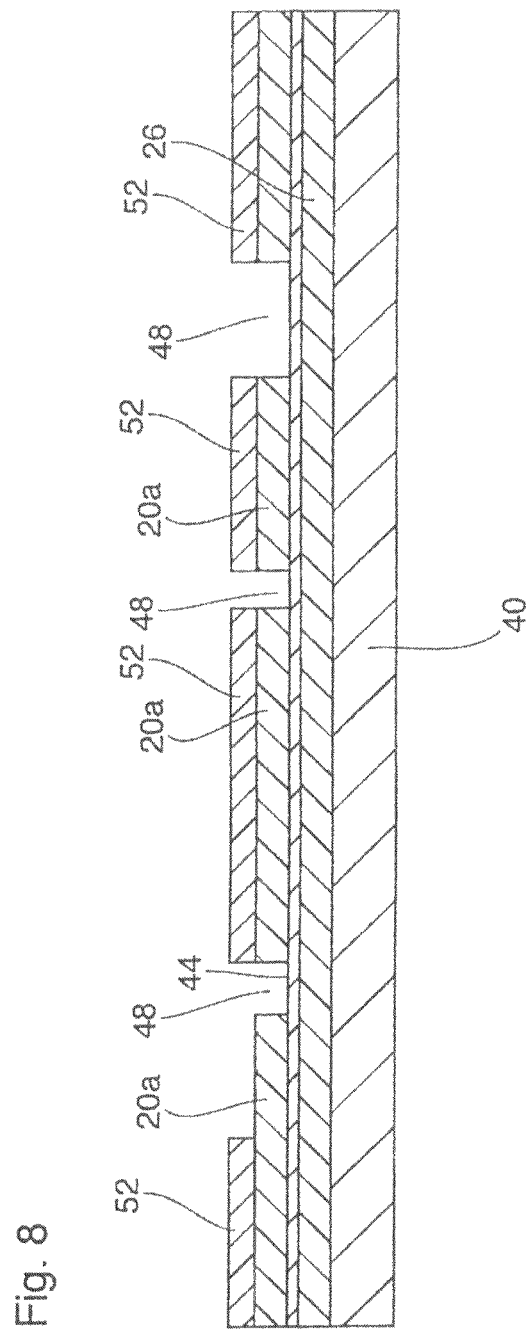
FIGS. 8 and 9 illustrate schematically the masking by sputtering mask coating of the etched BCB top layer and subsequent gold deposition for infilling of the vias and formation of overlying gold traces on the top surface.
Figure 9:
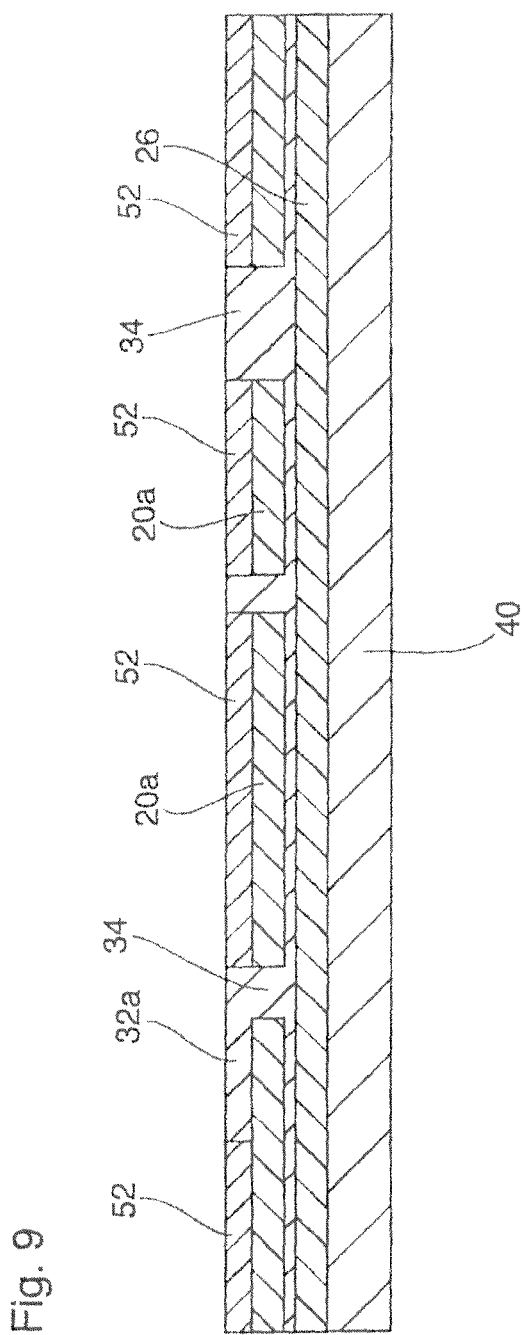

As shown in FIG. 7, following etching, the entire surface of the assembly is thereafter exposed to ultraviolet light (at 24 J/cm$^2$), and again washed with MF-319 Developer™ to remove the remainder of the photoresist layer 46. After spin washing with deionized water, the portions of the etched BCB structural layer 20a is thus again exposed. The BCB structural layer 20a is then mask printed with a selected photo print sputter mask layer 52. The photoprint masked layer 52 is chosen to allow for the selective deposition of gold to form the portion of the selected circuit architecture 12 on and through the BCB structural layer 20a. Following mask printing, the assembly is then subjected to gold vapor deposition or sputtering to effect the gold infilling of the formed vias 48 to form both the desired infilled via interconnects 34 and gold traces 32a on the upper surface of the layer 20a (FIGS. 8 and 9). The gold infilling of the vias 44 extending vertically through the layer 20a thus provides electrical connection between the ground layer 44, and gold trace 32a patterning.

Figure 10:
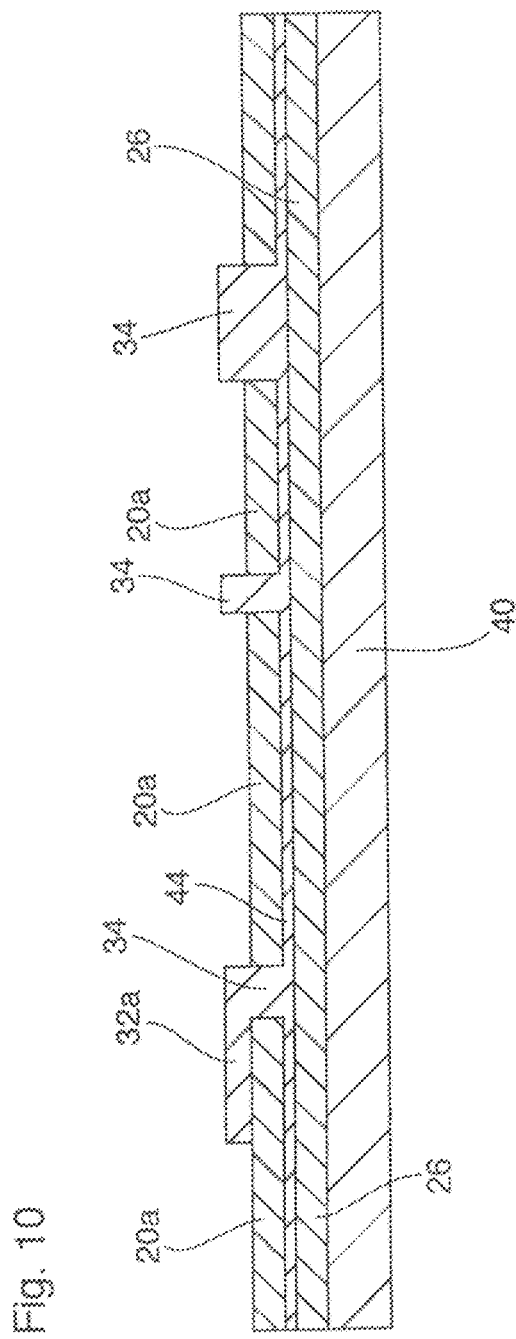
FIG. 10 illustrates the partially formed integrated circuit following removal of the sputtering mask coating to expose first layer gold trace wires connected with vias vertically.
Figure 11:
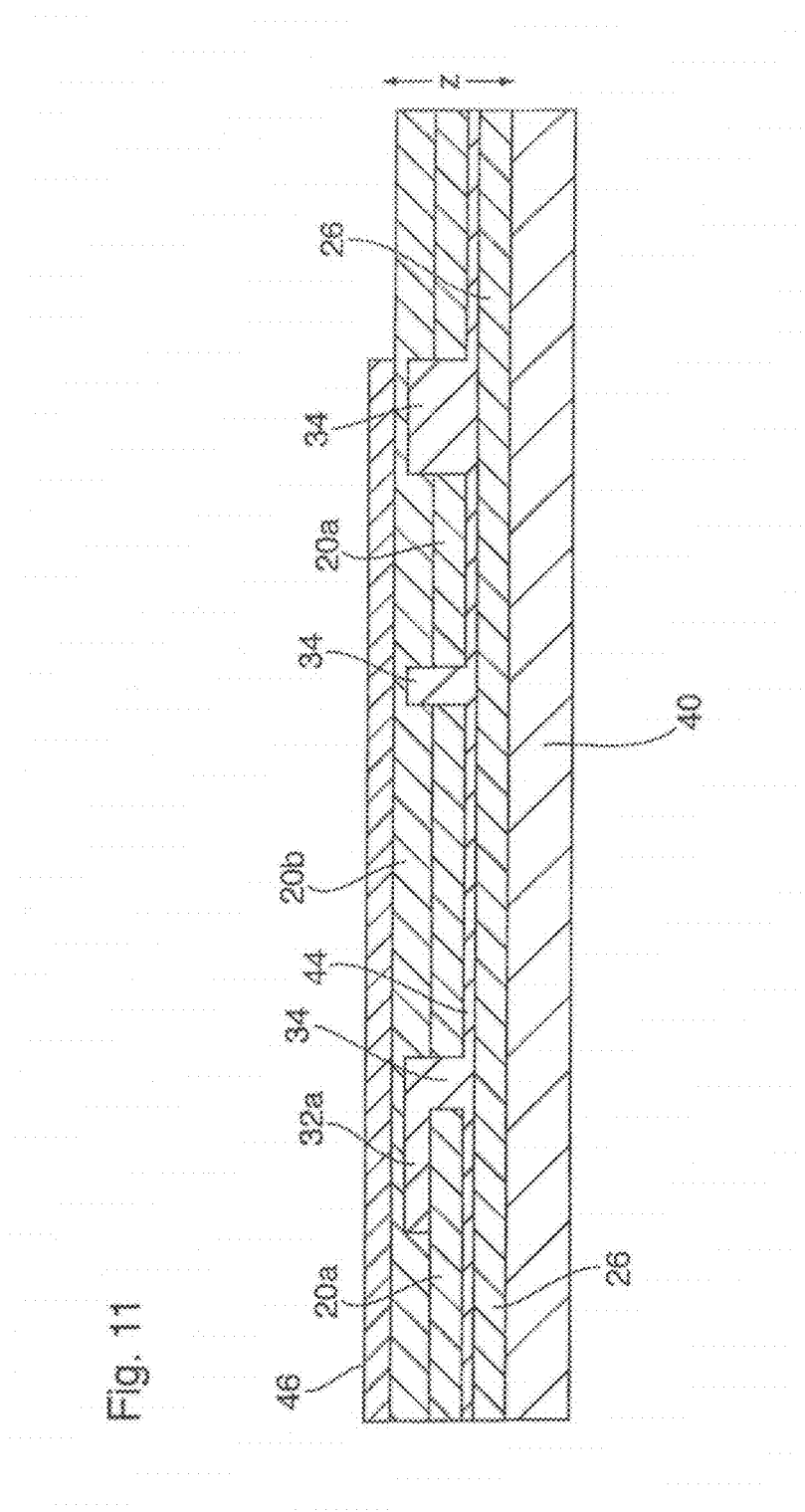
FIG. 11 illustrates schematically the formation of the following third BCB structural layer on the assembly, and the subsequent BCB coating with photoresist masking.

As shown best in FIG. 10, after sputter deposition of the gold, the remainder of the mask layer 52 is removed, and the partially cured BCB layer 20a, gold traces 32a and ends of via interconnects 34 are thus exposed. The integrated circuit 10 is built up vertically in the z direction on a layer-by-layer manner by the subsequent BCB spin coating, etching and gold deposition of successive layers 20b, 20c, 20d . . . 20f is a similar manner to the deposition of BCB layer 20a. As shown in FIG. 11, following exposure of layer 20a, the next second BCB structural layer 20b is spin cast deposited onto the assembly over both the exposed layer 20a and traces 32a and interconnects 34 to a desired vertical thickness, and which is preferably selected at between about 3 and 50 µm. Following deposition of layer 20b, the stacked assembly is again oven cured in the manner previously described to achieve approximately 45 to 75%, and preferably about 60% curing of the newly added second BCB structural layer 20b. This subsequent curing of BCB layer 20b further achieves the more complete or even full curing of the previously deposited structural BCB layer 20a.

Figure 12:
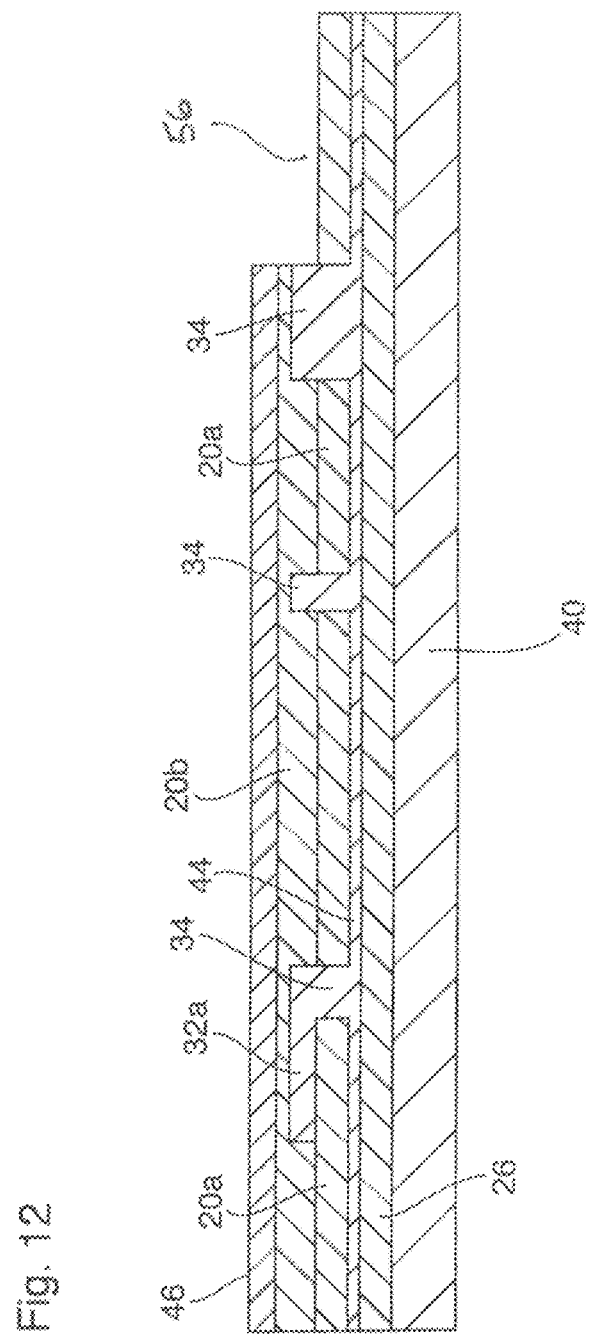
FIGS. 12 and 13 illustrate schematically the etching of larger component cavities across multiple BCB layers, and photo printing the third BCB layer applied in FIG. 11.
Figure 16:
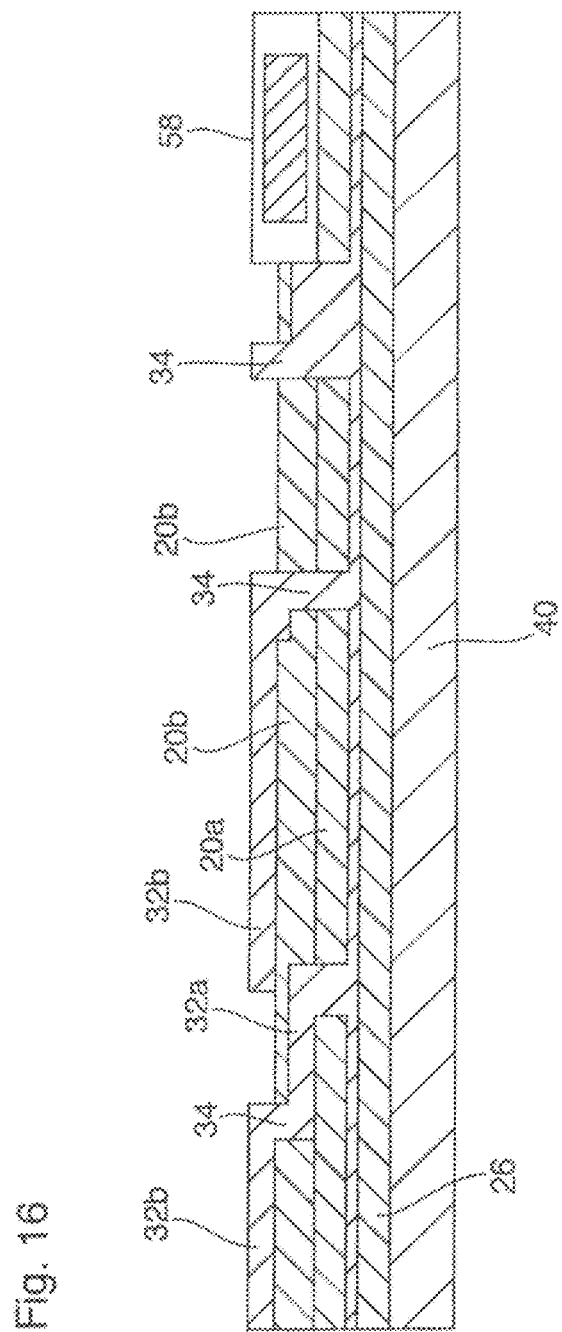
FIG. 16 shows schematically the next layer gold trace wires and infilled vias formed in gold sputtering and the positioning of a shielded component chamber in the formed component cavity.

Following partial curing of the second BCB layer 20b, a positive photoresist layer 46 (FIG. 11) is again deposited on the assembly over the BCB layer 20b. If of interest, optionally, differing sequential masks 46,46' (FIG. 13) may be provided to achieve etching and thereafter masking of the underlying BCB structural layers 20b and/or 20a to differing depths. As shown in FIG. 12, etching may be achieved in a first stage to remove selected enlarged areas of the BCB layer 20b to form one or more pockets 56. The pockets 56 may be sized to receive and house a specific electronic component 36a, 36b, 36c . . . (FIG. 20) as an embedded feature integrally formed within the integrated circuit 10 interior. In one possible construction, the chosen component 36c may be provided within a metal RF shielding housing or chamber 58 (FIG. 16). The chamber 58 may act in concert with the placement of multiple BCB structural layers 20a, 20b, 20c to mount the component 36 therein so as to be both electrically insulated whilst providing conductive surface areas for electronic connection to electrical traces 32 and/or vias interconnects 34 necessary to complete the circuit connections. The assembly is then photo printed through a negative mask process to expose the surface portions of the layer 20b, the exposed areas where vias 48 are to be formed to interconnect with earlier formed gold traces 32a or infilled interconnects 34 (and if applicable pockets 56) in essentially the same manner marking and etching of BCB layer 20a described with reference to FIGS. 4 to 6. It is to be appreciated that in the manufacture of the integrated circuit 10, any desired additional circuit components 36a, 36b, 36c may be embedded within the circuit structure by the formation of suitable pockets 56 in the same manner as described with respect to the placement of the shielded chamber 58.

Figure 13:
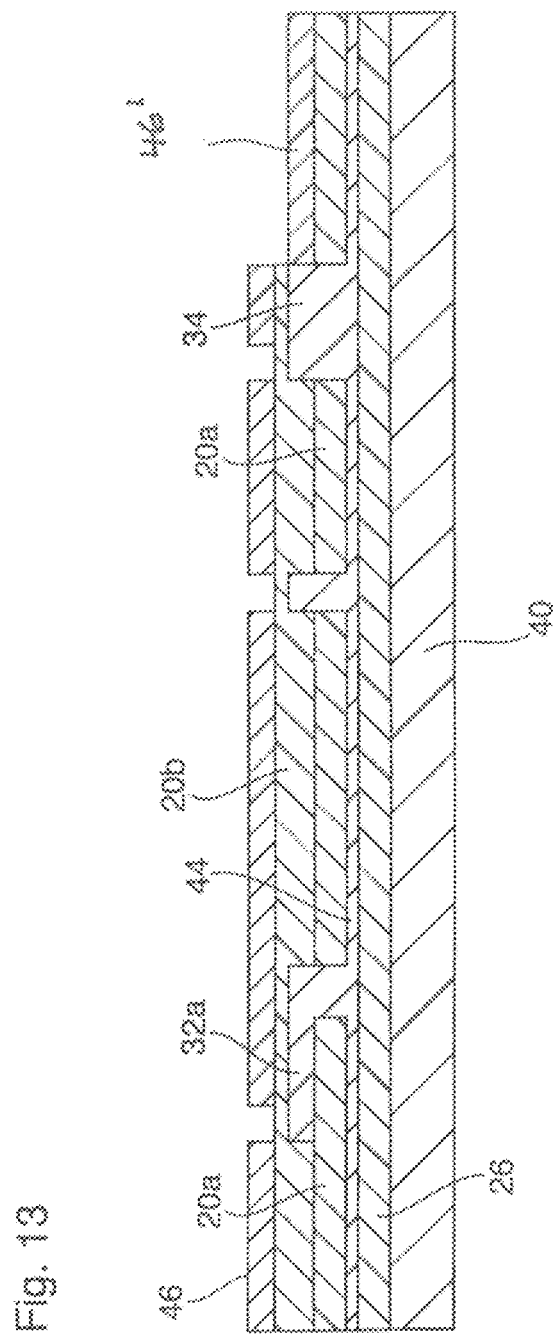
Figure 14:
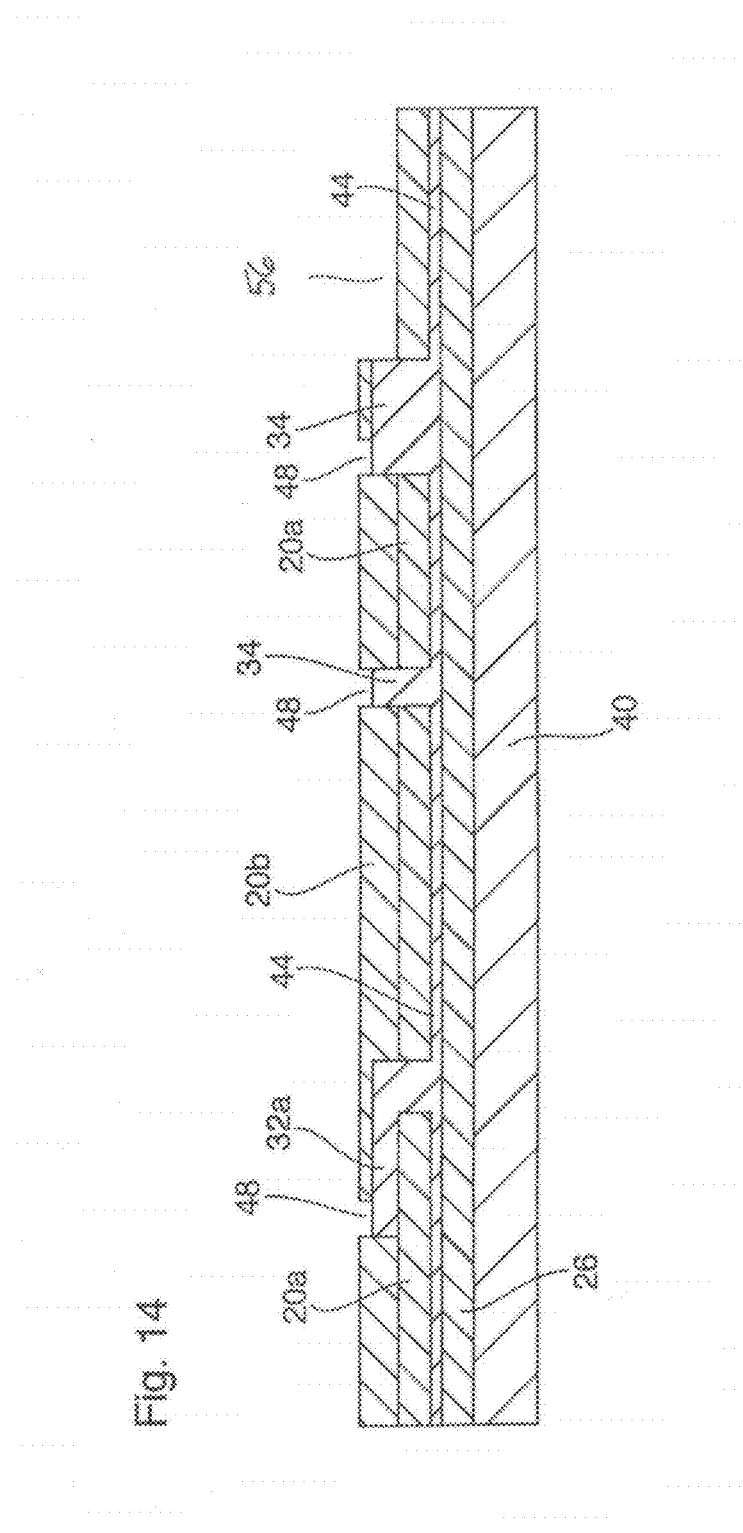
FIG. 14 illustrates schematically the construct following exposure and development of the photoresist mask layer from the assembly shown in FIG. 13 for via formation and the subsequent removal of photoresist.

In the subsequent etching step shown in FIG. 13, additional photoresist layer 46 is applied and further etched to expose the additional underlying portions of the BCB structural layer 20b for via and electrical trace formation. In the manner described with respect to FIG. 7, following exposure and etching, the photoresist mask layer 46,46' is removed, to expose the fully etched BCB layer 20b, formed vias 48 and pockets 56 (FIG. 14).

The construct is again cleaned for application of a sputter mask layer 52 and subsequently sputter gold deposition is performed in the manner described with respect to FIGS. 8 and 9.

Figure 15:
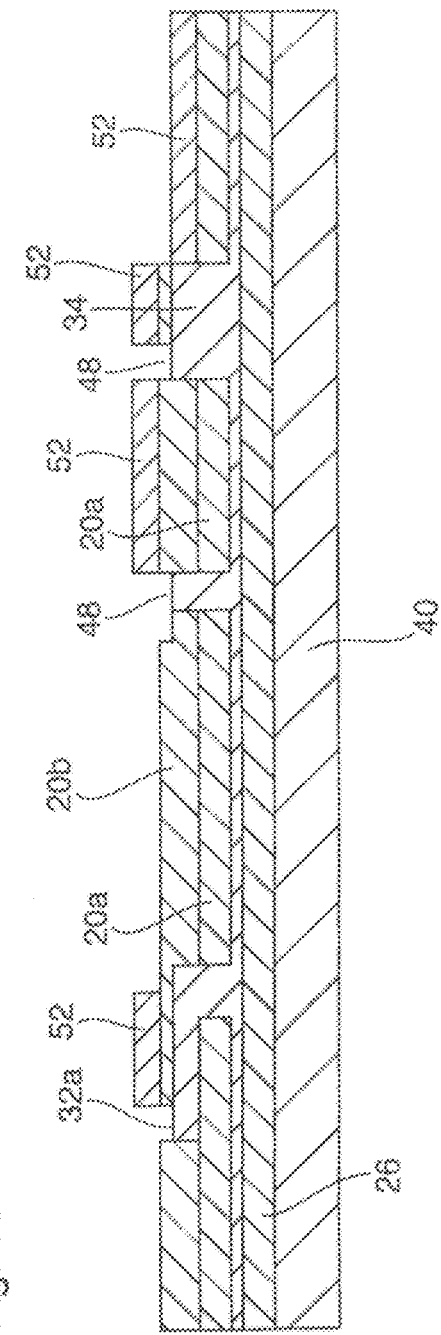
FIG. 15 illustrates schematically the masking for gold sputtering of the assembly to form a next layer of gold trace wires and effect via infilling.

As shown in FIG. 15, following cleaning, a sputter mask layer 52 is applied to provide the desired geometry of the gold interconnects 34 and trace wires 32b to be formed as the part of the circuit geometry 12 on the second BCB structural layer 20b. The assembly construct is then subjected to gold sputtering to infill the vias 48 and form the desired via interconnects 34 and next level surface traces. As well, following removal of the sputter mask layer 52, the shielded chamber 58 may be positioned in the formed pocket 56, as for example is shown in FIG. 16.

Figure 17:
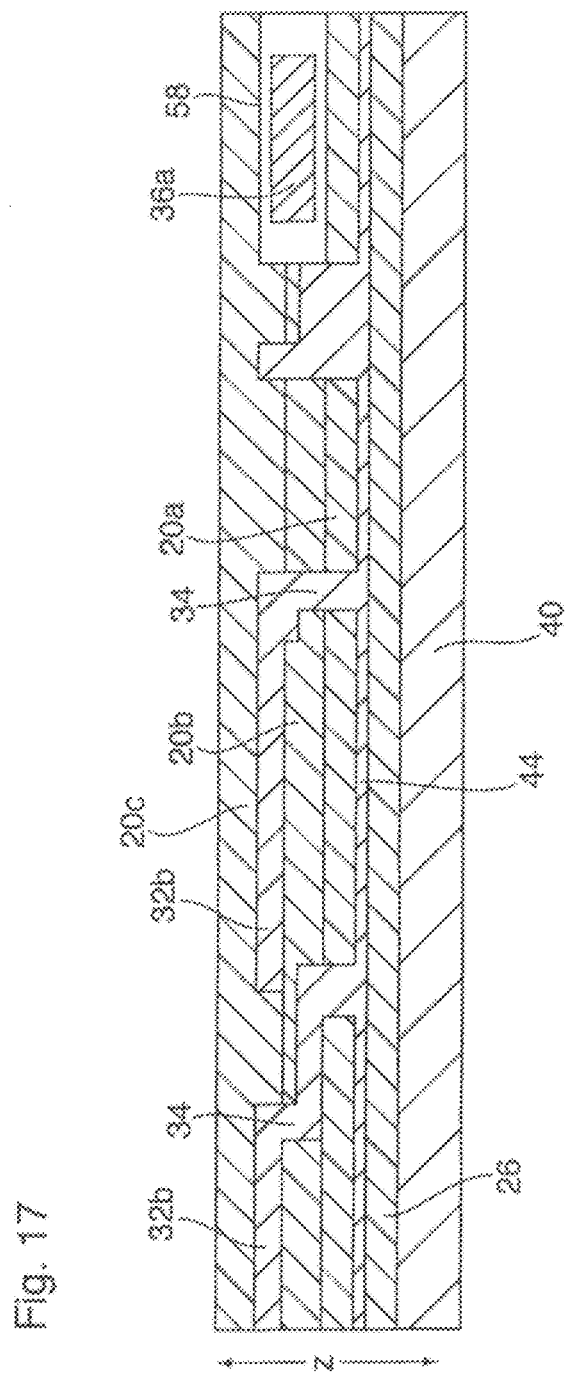
FIG. 17 illustrates schematically the formation of a next further BCB structural layer, prior to subsequent etching and mask photo printing.
Figure 18:
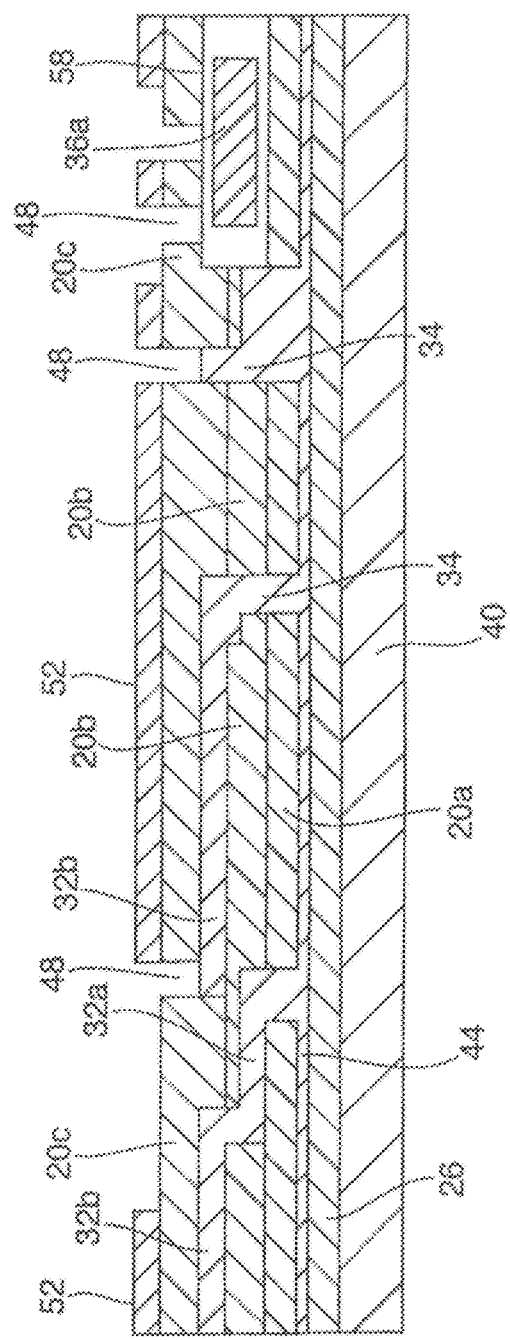
FIGS. 18 and 19 illustrate schematically the mask etching and gold via infilling and printing of top-most circuit trace wires on the added BCB structural layer illustrated in FIG. 17.
Figure 19:
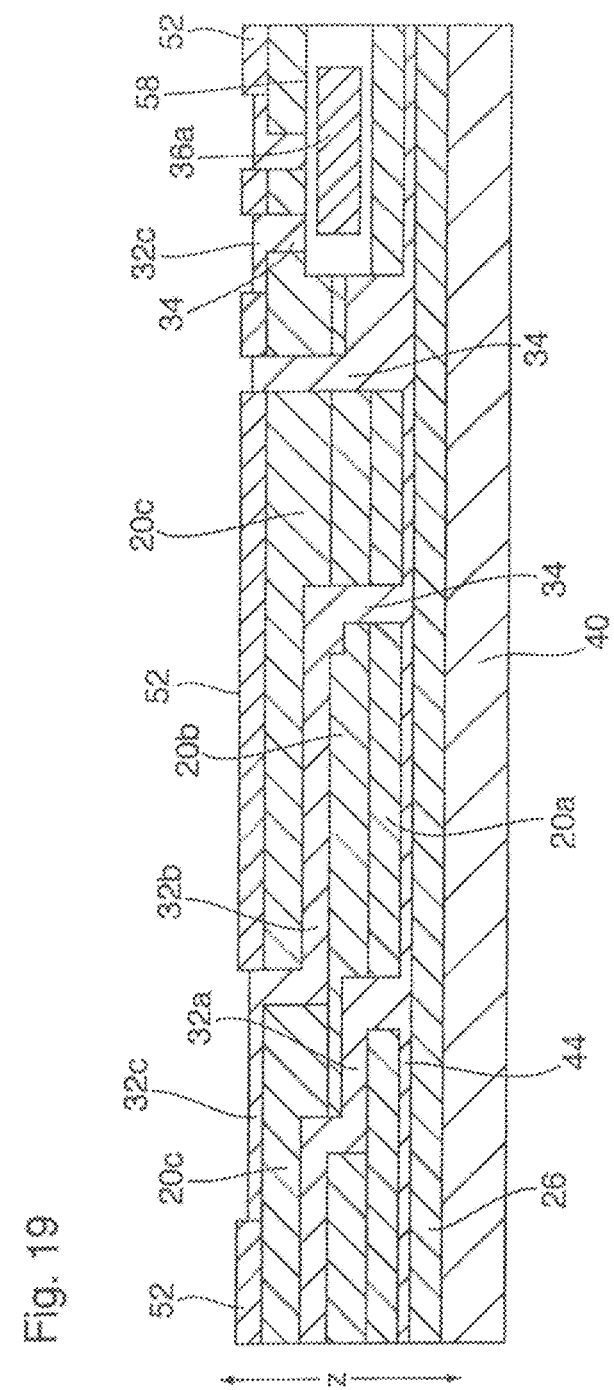
Figure 23:
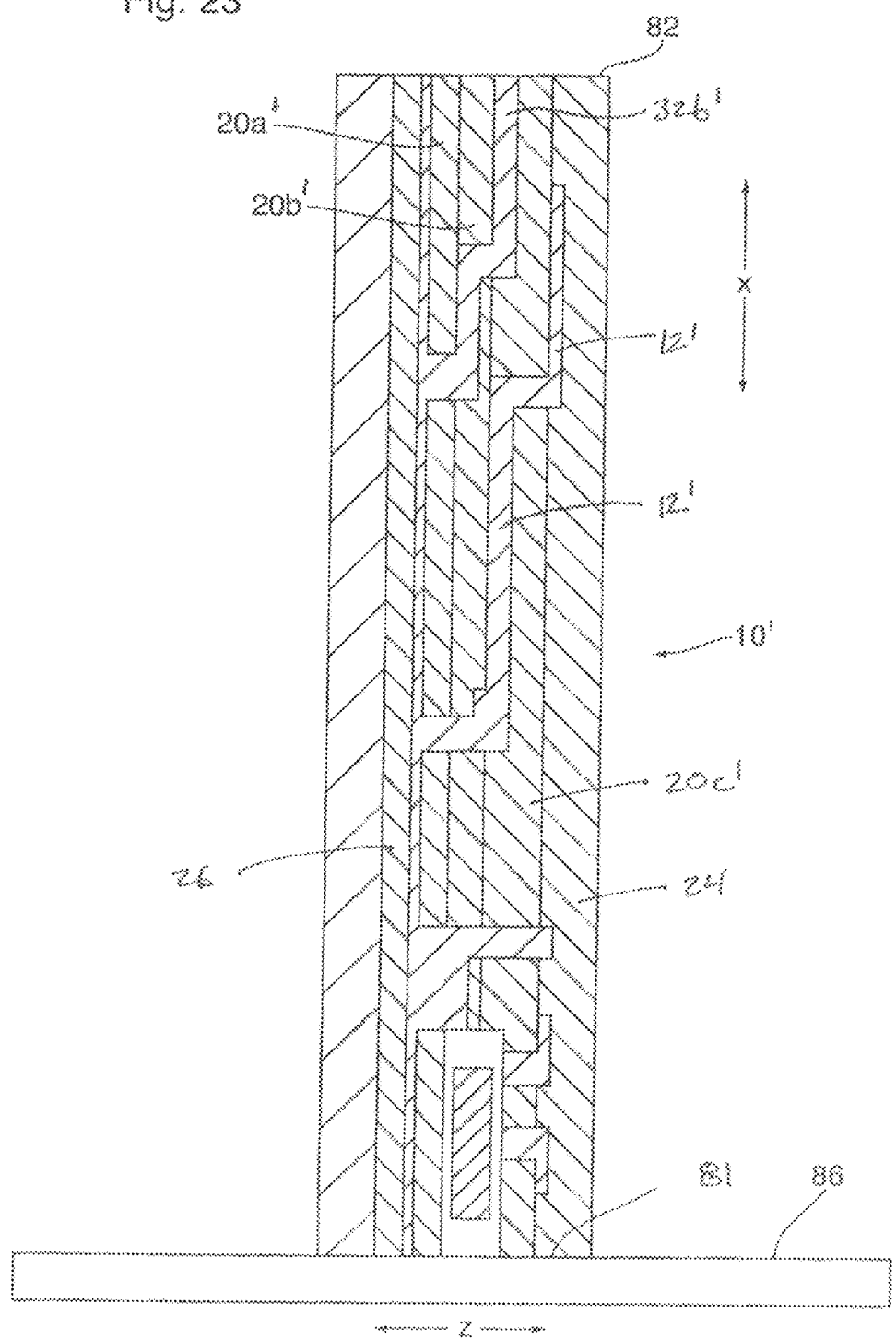
FIG. 23 illustrates schematically the formation of an integrated circuit package by the subsequent formation of a stacked integrated circuit along a lateral side face of a vertically stacked 3D integrated circuit in accordance with an alternate method.

As shown in FIG. 17, the next BCB structural layer 20c is spin deposited over the BCB structural layer 20b, shielded electrical chamber 58, exposed interconnects 34 and gold trace wires 32b, in the same manner as the spin deposition of BCB layer 20b. It is to be appreciated that the BCB layer 20c may be provided with a selected thickness in the vertical Z-direction chosen to completely cover not only the gold traces 32b, but also any thicker components 36 partially embedded in the underlying layers 20a,20b. The assembly is then again placed in an oven to partially cure the BCB structural layer 20c to between about a 45 to 75%, and preferably approximately a 60% fully cured rate, with the partial curving simultaneously effecting more complete curing of the earlier formed layers 20a and/or 20b.

The BCB structural layer 20c is then etched in the manner as previously described using the sputtering mask coating 46 printed thereon, to form the desired via configuration and expose portions of the BCB layer 20c.

After etching and cleaning, the assembly is then again subjected to next-layer gold deposition and sputtering in the manner described with reference to FIGS. 9 and 10 to effect the desired via infilling, forming the surface gold traces 32c and interconnect 34 (FIGS. 18 and 19) on the surface of the BCB layer 20c. It is to be appreciated that after gold sputtering the remaining sputter mask layers is removed. Subsequent BCB layers 20 and associated interconnects 34 and gold traces 32 may be added in the identical manner as BCB layers 20b and 20c. In this manner, additional BCB structural layers interconnected by gold infilled vias and having the desired gold trace wires and/or electronic components thereon may further be formed building up the desired circuit geometry 12 in the identical manner described.

Once the desired number of structural BCB layers 20a, 20b, 20c are formed to provide stacked circuit geometry 12 the covering BCB top layer 24 is formed by spin depositing BCB (FIG. 20). Following spin deposition, the construct is then placed in an oven and heated to achieve the full curing of all of the BCB layers 24, 26, 20a, 20b, 20c. In the embodiment shown in FIG. 20, the integrated circuit 10 is illustrated as being mounted on the silicon wafer 40 for ease of handling. As shown with respect to FIG. 2, optionally, the silicon wafer 40 is preferably provided with a top-most silicon oxide surface 42 which is selected to allow for the release of the circuit 10 from the wafer 40 for use in subsequent manufacture. After curing the integrated circuit 10 may thus be detached from the silicon holder wafer 40 by dissolving the oxide layer 42.

FIG. 21 illustrates a further embodiment of the integrated circuit 10 wherein like numerals are used to identify like components. In the embodiment shown, the integrated circuit is illustrated as provided with three structural BCB layers 20a, 20b, 20c as well as top and bottom BCB layer 24,26. In the illustrated construction, the top BCB layer 24 is provided with a vertical thickness in the z direction selected to house therein selected circuit electronic components 36a, 36b, 36e, 36d, 36e. In the manufacture of the illustrated circuit 10, following the deposition of gold traces 32c on BCB layer 20c, the components 36a, 36b, 36c, 36d, 36e are positioned on the layer 20c in the desired electrical communication with the one or more gold traces 32c and/or interconnects 34. Following positioning of the components, the top layer 24 is spin deposited with a vertical thickness selected to substantially encapsulate the components 36a-36e MEMS, NEMS and/or photonic dies shown as provided as embedded circuit components 36 within the topmost layers 24 of each integrated circuit 10 in the manner shown in FIG. 21, may also be prefabricated and embedded at a later date.

The applicant has further appreciated that in an alternate embodiment, a number of vertically stacked integrated circuits 10 may be interconnected in the lateral x and/or y directions along their lateral side faces. Reference may be had to FIGS. 22a and 22b which illustrate a combined 3D package 100 which incorporates four vertically stacked integrated circuits 10a, 10b, 10c, 10d which have been formed in accordance with the method of manufacture previously described, and wherein like reference numerals are used to identify like components.

Each of the stacked integrated circuits 10a, 10b, 10c, 10d are provided with a respective 3D circuit architecture 12. In the package 100, abutting lateral side faces of adjacent integrated circuits 10a, 10b, 10c, 10d are provided in electrical communication with a respective, interposed interconnection card 70. Most preferably, each interconnection card 70 is positioned within a space 80 interposed between the adjacent sides of each integrated circuit 10a, 10b, 10c, 10d. The interconnection cards 70 are provided with a series of cantilever-type spring based electrical connectors 72. The connectors 72 provide bridging electrical connection between the circuit geometry 12 of each adjacent integrated circuit 10a, 10b, 10c, 10d without the need for wire bonding, micro bump formation or TSVs.

The package 100 enables high density, low loss interconnection among integrated circuits 10a, 10b, 10c, 10d and electronic ICs, such as analog/RF, digital, memory, and other micro-processing devices, but also simplified integration of the embedded of MEMS/NEMS/microfluidic dies, sensor and actuators.

In one possible embodiment, each lateral interconnection card 70 may be provided as a MEMS interconnect card 70 which enables lateral interconnection of comparatively smaller sections of polymer dielectric layers, such as those made from BCB, and the formation of a comparatively larger overall package 100. Optionally one or more circuit components 36 may be further integrated into juxtaposed lateral faces of the integrated circuits 10a, 10b, 10c, 10d using MEMS interconnection card 70.

In the case where the package 100 is to be used as part of an RF system, RF active components can be further prefabricated on a suitable substrate, such as GaAs, SiGe, and the like. Passives of MEMS RF components can be connected to the package 100 later either vertically or laterally as necessary. In addition, high density void free inter-metal connections may be used either with lift-off lower thickness or higher thickness metal platings with a pitch of 10 microns or less.

It is be appreciated that the infilled via interconnects and/or conductive traces wires 32.34 may be used to provide electrical connections to contact pads or connector points for the MEMS interconnection cards 70 shown in FIGS. 22a and 22b. Alternately, other suitable connector clips may be used. Further although a single circuit cube package 100 is described this process could be scaled to produce a construct 100 having multiple integrated circuit 10a, 10b . . . 10n extending in different directions.

In one possible construction, the MEMS based interconnection card 70 may be formed by electro deposition or plating conductive metal vias such as a copper or gold formed through a 200 micron thick microfabricated SU-8 interconnection card. The spring connectors 72 are preferably provided as high residual stress micro-cantilever springs. The connectors 72 provide the required resilient spring force preferably project laterally on both sides of the interconnection card 70 to maintain electrical connections between the adjacent integrated circuit 10a, 10b, 10c, 10d.

The spring connectors 72 are positioned for electrical engagement with selected edges of exposed traces 32a, 32b, 32c . . . 32n or interconnects 34 formed at integrated circuit BCB layer 20a, 20b, 20b . . . 20n of each circuit 10. When the interconnection card 70 is inserted in position interposed between adjacent integrated circuits 10a, 10b, 10c, 10d, the spring connectors 72 thus resiliently engage the edges of exposed edge portions of the electric traces 32a, 32b, 32c . . . 32n to generate the necessary interconnection force required for conductivity therebetween.

The applicant has appreciated that the 3D package solution 100 shown in FIGS. 22a and 22b allows for a highly reliable, smaller dimensioned interconnect and packaging system to be achieved. Further, as conceivably the use of TSVs will be avoided, the problems of stress-induced reliability electron and whole mobility degradation short circuiting and dielectric cracking may be reduced.

Although FIGS. 22a and 22b illustrate the use of MEMS interconnection card 70 as used to electrically connect adjacent integrated circuits 10a, 10b, 10c, 10d, the invention is not so limited. It is to be appreciated that in alternate configurations, other modes of interconnecting laterally adjacent integrated circuits may also be used.

Reference may be had to FIGS. 23 to 27 which illustrate a further method of manufacturing and integrated circuit package 100 in accordance with an alternate embodiment the present invention, and wherein like reference numerals are used to identify like components.

In accordance with the method, a first vertically stacked integrated circuit 10' is manufactured using a layer-by-layer BCB build up in a first Z direction. The vertically stacked integrated circuit 10 thereafter is subjected to the formation of one or more additional layer-by-layer build up in the lateral X and/or Y directions, to form at least one laterally stacked integrated circuit 10" directly thereon.

In particular, a first integrated circuit 10' is manufactured by initially forming an integrated circuit stacked in the vertical Z direction, as for example, in accordance with the same method previously described with references to FIGS. 2 to 20. Following the formation with the achieved number of stacked BCB-layers 20a', 20b' . . . 20n and corresponding 3D circuit geometry 12', the integrated circuit 10' may be separated from the silicon wafer 40 or alternately, if necessary, wafer 40 may be maintained to provide added structural support to the construct during subsequent manufacture.

Each lateral ends 81,82 of the integrated circuit 10' are thereafter cut or ground to a selected tolerance as parallel planar end faces, exposing selected edge portions of the circuit architecture 12. Once ground, one end 81 of the integrated circuit 10' is remounted on a suitable silicon substrate 86 by the use of a suitable silicon dioxide f54 adhesive, and with the other selected ground end face 82 with the exposed circuit architecture 12 oriented upwardly, as for example, in the position shown in FIG. 23.

Figure 24:
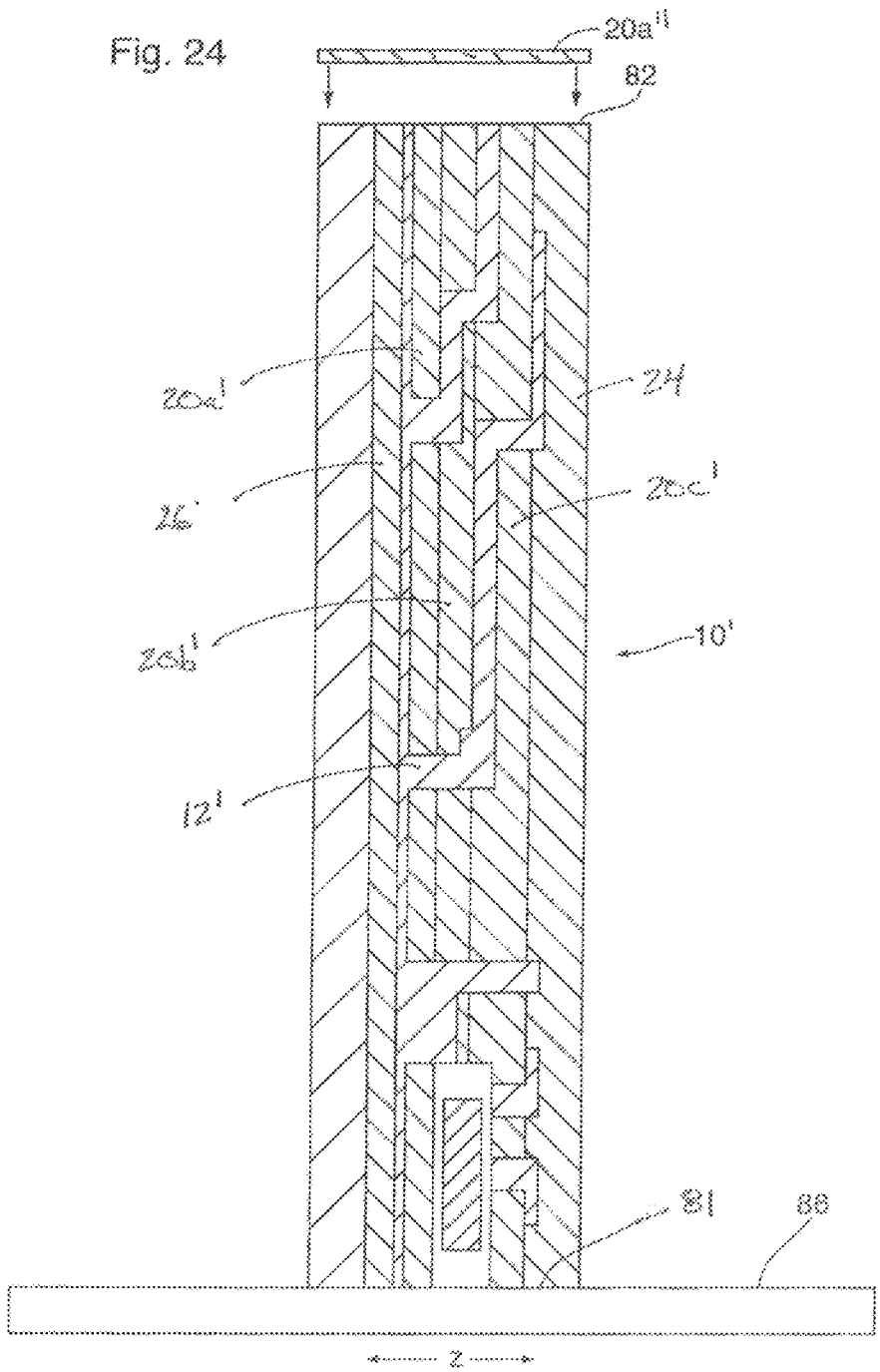
FIG. 24 illustrates the spin casting of a first lateral BCB layer on the exposed lateral side face of the vertically 3D integrated circuit shown in FIG. 23.

As shown best in FIG. 24, following its formation the vertically stacked, integrated circuit 10' is positioned on a new handling base 86 with the selected lateral face 82 orientated upwardly. The lateral face 82 is then optically imaged; measured; and/or photographed to identify and accurately locate the exposed ends of each of the ground layer 44, infilled interconnect and/or conductive trace wire 32b' in each stacked layer 20a', 20b', 20c' which extend to the face 82. The image data is then used to develop a mask for the desired via, wire or trace formation to be formed along the lateral face 82.

Once so positioned, a next stacked integrated circuit 10" is formed directly on the re-mounted integrated circuit 10', by repeating the process of successive spin deposition of BCB layers etching, masking and gold deposition in a lateral x direction relative thereto.

Thus electrical connection and communication with the formed circuit architecture and/or electrical components in the next stacked circuit 10" may be achieved by successive BCB layer build up, and interconnect 34 and/or trace wires formation along one or more lateral faces of the originally formed integrated circuit 10'.

More particular, one or more stacked BCB layers 20a", 20b", 20c" (FIG. 27) are formed successively on the lateral side 82 of the circuit 10' in the lateral orientation, approximately 90° relative to the initial vertical stacking direction Z of the first circuit BCB layers 20a,'20b', 20c' in the same manner as described with reference to FIGS. 3 to 20 Preferably, where a first laterally deposited BCB layer 20a" is to be formed directly on the lateral end face 82 a suitable adhesion promoter layer (not shown) such as AP3000™ is first applied to the ground end face 82.

Figure 25:
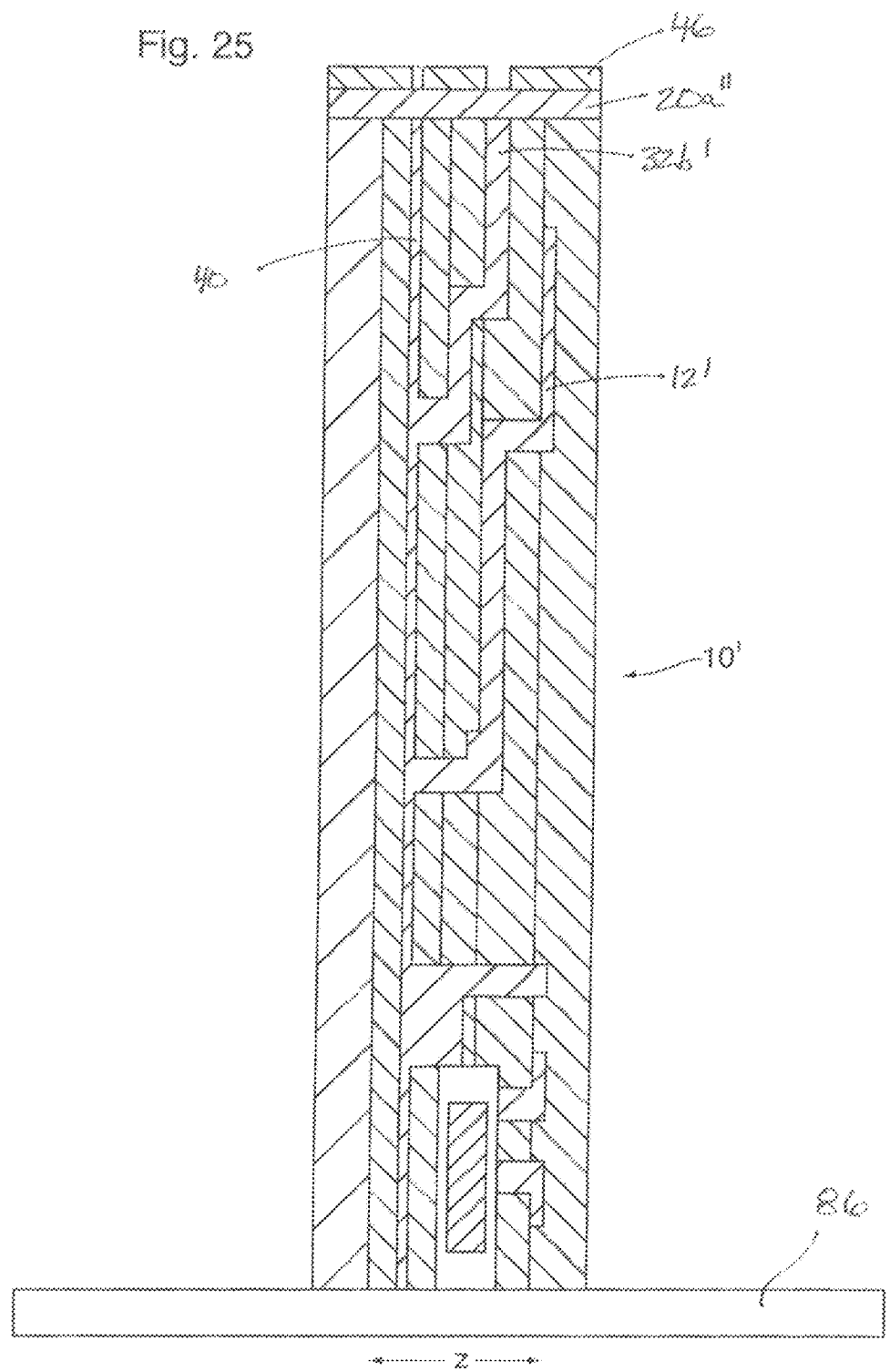
FIG. 25 illustrates the schematically the partial removal of a photoresist layer for formation of vias holes in the first lateral BCB layer shown in FIG. 24.
Figure 26:
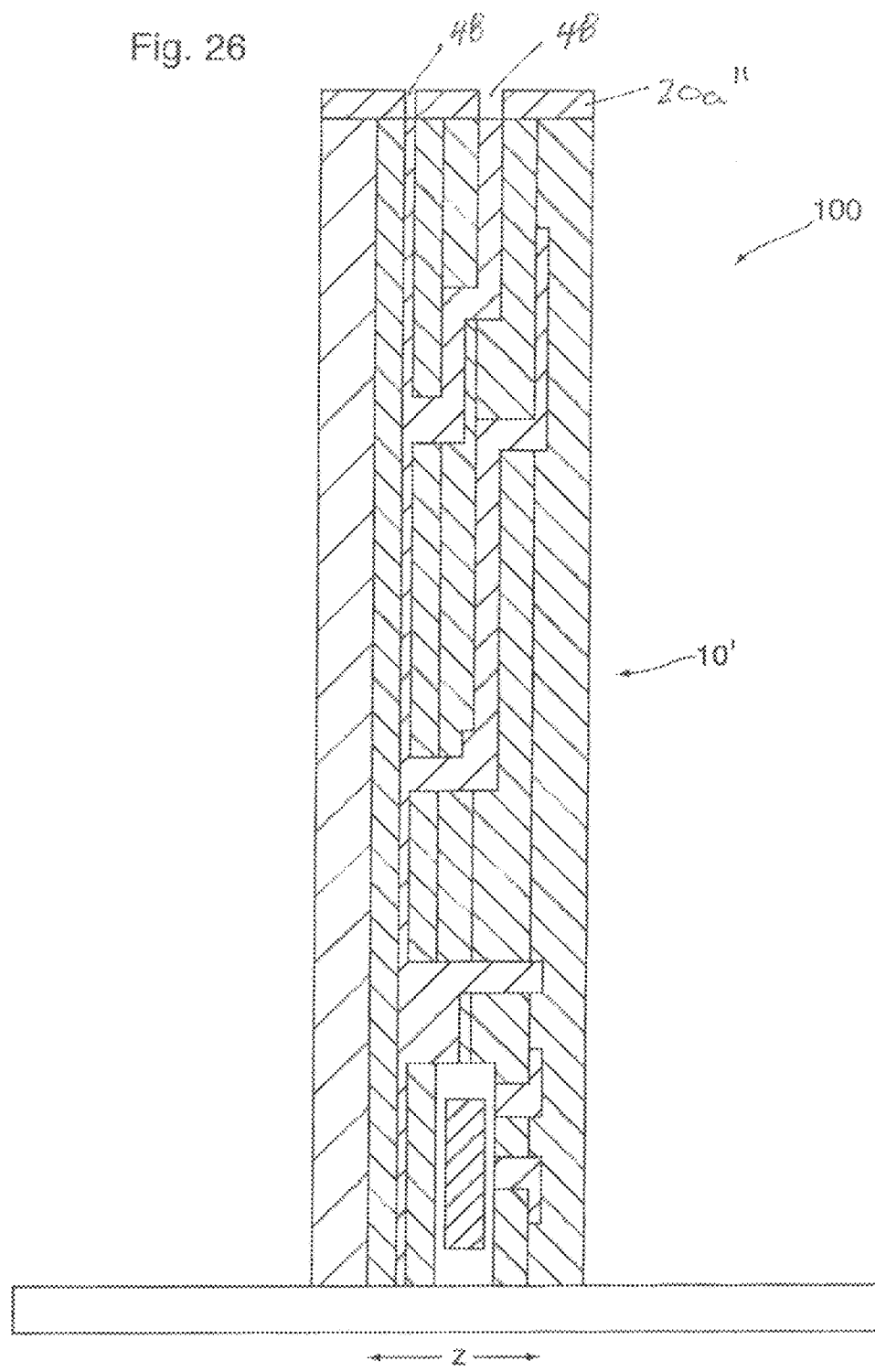
FIG. 26 illustrates schematically the etching for subsequent infilling of the via holes of FIG. 25 to provide electrically communication between vertical traces and connector points in a next laterally formed BCB layer, in the formation of the package of interconnected integrated circuits.

FIGS. 24 and 25 which illustrate the formation of a first lateral BCB layers 20a" on the end face 82, and its subsequent preparation for etching to form corresponding infilled interconnects and electric trace wires 32, in manufacturing a second 3D electrical architecture 12" which electrically communicators with the electrical architecture 12' of the integrated circuit 10'.

Figure 27:
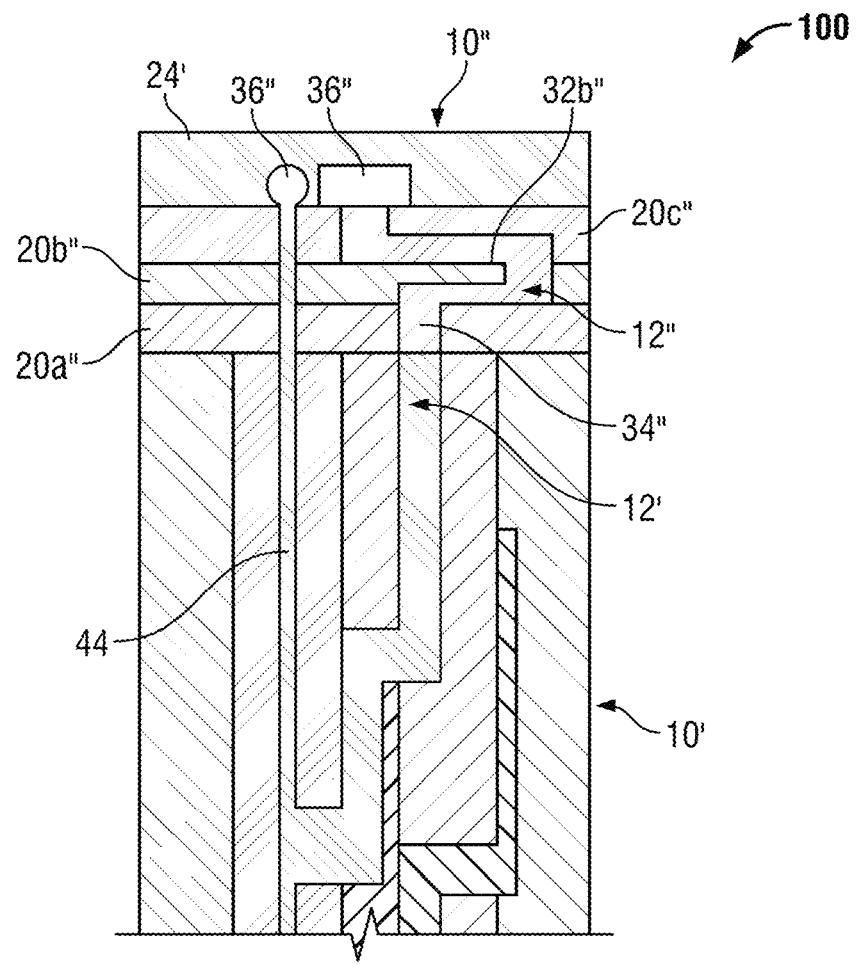
FIG. 27 shows an enlarged partial view of the package showing the electrical communication of lateral stacked 3D integrated circuit in the vertically stacked circuit.

The formation of the lateral BCB layers 20a', 20b', 20c' top layer 24" and associated 3D circuit architecture 12" is achieved in essentially the same manner as that used in the manufacture of the vertically stacked integrated circuit 10'. The first lateral BCB layer 20a" is initially deposited directly over the lateral face 82, as for example by spin-casting. Following deposition, the construct is heated in an oven in the manner described to achieve partial, and preferably about 60% of fully curing of the first deposited lateral BCB layer 20a". The BCB layer 20a" is then covered with a suitable photoresist layer 46 (FIG. 25) and mask exposed. The mask pattern is chosen to allow for the formation of ground wires, electrical traces, and/or interconnects which provide electrical communication with exposed ends of the electrical architecture 12'. Following mask exposure, vias holes 48 (FIG. 26) are formed by etching through the BCB layer 20" and if necessary partially into the lateral end 82 of integrated circuit 10', exposing the ends of the trace wires (i.e. trace 32b') where they project to the lateral circuit face 82 in the manner described with reference to FIGS. 5 and 6. After exposure, the photoresist layer 46 is removed and the construct cleared. A sputter mask layer, such as layer 52 shown in FIG. 7 is applied, the sputter mask layer is selected whereby vias 48 are infilled with a suitable conductive metal, such as gold or copper, to thereby form conductive interconnects as well as conductive traces of the 3D electrical architecture 12" at layer 20a" (FIG. 27).

Following formation of the interconnects and conductive traces or layer 20a", a next subsequent lateral BCB structural layer 20b" is spin deposited on the construct again followed by the steps of mark etching and deposition interconnect and wire traces. In this manner, a series of laterally oriented BCB structural layers 20a"20b", 20c" are successively built up on the lateral face 82 of the integrated circuit 10', with corresponding portions of the electrical architecture 12. It is to be appreciated such build up, effectively extends the integrated circuit package 100 in the lateral X direction at 90° to the original vertical Z direction (FIG. 25) of the original vertical structural BCB layer 20a, 20b . . . 20n stacking. The integrated circuit package 100 may therefore be provided with one or more laterally stacked BCB layers and which, in turn possesses their own circuit geometry 12" of embedded trace wires 32, interconnects 34" and/or electrical components 36" in the same manner as those in vertical stacked layers 20a, 20b, 20c . . . 20n. After formation of the laterally stacked BCB layers 20a", 20b", 20c" a top most layer 24", and optionally one or more selected circuit components 36" may be positioned over the upper most layer 20c". It is to be appreciated that following the buildup of the structural layers 20'a, 20'b, 20'c in an X direction, the assembly could again be reoriented and further BCB layers on a further lateral face in a direction normal to a build up direction for a particular portion.

Formed package 100 would thereby include stacked layers of BCB formed in multiple different directions, providing electrically connected integrated circuits 10 with a still more overall compact structural footprint.

Although the detailed description describes the formation of a three-dimensional integrated circuit 10, the invention is not so limited. It is to be appreciated that the present process and manufacture may be used to manufacture a number of different types of multi-layer circuits and/or electronic constructs which will vary in design and final properties depending on the desired application.

The applicant has appreciated that the present method of manufacture provides various advantages and/or may possibly include one or more of the following non-limiting features, process parameters or techniques.

1. BCB layer placed by spinning allowing very precise control of thickness and provide ultra-flat layer surface due to spinning, and allow for compensation of surface tensions creating through the curing process wherein the BCB volumetrically shrinks.
2. Individual BCB structural layers can be controlled and formed to any thickness to facilitate structures and design.
3. Process allows the formation of metal chambers within individual or multiple BCB layers, which provide RF shielding and electrical insulation for devices, components, vias, and conducting traces. Full metal encapsulation for RF shielding is possible in all three directions (laterally, vertically, and horizontally)
4. Metal sheets may be deposited between and/or within layers of the BCB and can be used to conduct heat out of the system and provide the required cooling and thermal control.
5. BCB structural layers may totally encapsulate components on systems to provide environmental and mechanically protection for systems in harsh environments, and permit the use of smaller conductor and traces fully supported by the structure of the encapsulating BCB.
6. Design thickness of BCB is that at final cure, thus the initially placed thickness may be selected to compensate for the volumetric shrinkage.
7. Overall volumetric shrinkage of BCB results in compressive load forces, and assures electrical contact due to the inherent stress in the direction of positive contact.
8. The use of multiple BCB layers permit multi directional and multi-layer circuit configuration at each level, providing for more compact circuits.
9. In the case of CMUTS, devices may be formed as integrated components within one or more of the BCB layers.
10. BCB layers may be developed on separate carrier, and later adhered to the top layer by BCB-to-BCB adhesion under semi-cured conductive of both layers.
11. The present method is adapted for use, readily available and proven technologies to develop multi-layer 3D integrated circuits and circuit density, with circuit building could be practiced on currently used and available equipment.
12. The present method may be used to build circuits that are totally lead and solder free assuring greater system stability and durability.
13. The present system may eliminate or reduce the need for electronic component packaging and gold bonding, since the structural BCB layers provide stable via type connections which are totally encapsulated. This provides for more compact circuit construction and conductor length between components allowing for faster circuit throughput.
14. Shorter circuit flow; gold to gold connections; and nano technologies all contribute to lower power requirements for these integrated systems.

Although preferred circuit components 36 are identified as including without restriction resistors, transistors, memory, capacitors, as well as other inductors, semiconductors, chips and the like other types of components 36 may be provided and will become apparent.

While the detailed description describes the stacked integrated circuit 10 with BCB top and bottom layers 24,26, the invention is not so limited. It is to be appreciated that the BCB structural layers, 20a, 20b, 20c . . . 20n could be provided in circuit designs with differing top and/or bottom layer configurations.

While the preferred embodiment describes the formation of the integrated circuit 10 with a conductive gold circuit architecture 12, it is to be appreciated that the circuit architecture 12 may be provided with different conductive metals or materials, without departing from the scope of the invention. It is to be appreciated that while spin casting may represent a preferred method of BCB layer deposition, the invention is not so limited. Other deposition and layer surface finishing processes may also be used including, without restriction, laser ablation, and/or mechanical polishing.

While the detailed description describes and illustrates various preferred embodiments, the invention is not so limited. Many modifications and variations will now occur to a person skilled in the art. For a definition of the invention, reference may be had to the appended claims.

We claim:

1. A method of manufacturing an integrated circuit, said integrated circuit comprising a plurality of benzocyclobutene resin (BCB) layers stacked in an orientation extending in a first direction, and a circuit geometry comprising a plurality of conductive electric traces and one or more conductive interconnects electronically connecting with one or more of said electric traces, and where respective portions of said circuit geometry are provided on and/or extend through part of an associated BCB layer, said method comprising, forming a construct including a first said BCB layer with top and bottom surfaces spaced in said first direction, initially heating said construct for a time selected to partially cure said first BCB layer to a 45% to 75% fully cured state, with said first BCB layer in the partially cured state, masking said top surface with photoresist coating, and after exposure, etching said first BCB layer to selectively form vias through said first BCB layer at locations corresponding to locations of said conductive interconnects of said respective portion of said circuit geometry associated with said first BCB layer, masking said top surface with a mask coating, and after exposure, depositing conductive metal on said first BCB layer to infill said vias and form the electric traces and conductive interconnects of the respective portions of the circuit geometry associated with said first BCB layer, forming a second said BCB layer on said first BCB layer top surface, said second BCB layer including top and bottom surfaces spaced in said first direction, heating said construct for time selected to partially cure said second BCB layer to a 45% to 75% fully cured state, and with said second BCB layer in the partially cured state, masking said top surface with a first photoresist coating, and after exposure, etching said second BCB layer to selectively form vias through said second BCB layer at locations corresponding to locations of said conductive interconnects of said respective portion of said circuit geometry associated with said second BCB layer, and masking said top surface with a mask coating, and after exposure, depositing conductive metal on said second BCB layer to infill said vias and form the electric traces and conductive interconnects of the respective portion of the circuit geometry associated with said second BCB layer, and wherein the plurality of BCB layers comprise a layer array, said integrated circuit further including a second layer array comprising a plurality of additional BCB layers provided in a stacked orientation extending in a second direction substantially normal to said first direction, said method further comprising:

forming a first said additional BCB layer on a side portion of said first layer array;

said first additional BCB layer having top and bottom surfaces spaced in a said second direction;

heating said construct for time selected to partially cure said first additional BCB layer to 45% to 75%, fully cured state, and while said first additional BCB layer is in said partially cured states, masking said top surface with photoresist coating, and after exposure, etching said first additional BCB layer to selectively form vias through said first additional BCB layer at locations corresponding to locations of said conductive interconnects of said respective portion of said circuit geometry associated with said first additional BCB layer; and masking said top surface with a mask coating, and after exposure, depositing conductive metal on said first additional BCB layer to infill said vias and form said electric traces and conductive interconnects of said respective portion of said circuit geometry associated with said first additional BCB layer.

2. The method as claimed in claim 1, wherein the respective portion of said circuit geometry associated with first additional BCB layer is selected to electrically communicate with at least part of the respective portion of the circuit geometry associated with at least one said BCB layers of the first layer array.

3. The method as claimed in claim 1, further comprising:

forming a second said additional BCB layer on said top of said first additional BCB layer, said second additional BCB layer including top and bottom surfaces spaced in said second direction;

heating said construct for time selected to partially cure said second additional BCB layer to a 45% to 75 fully cured state, and with said second additional BCB layer in the partially cured state;

masking said top surface with a first photoresist coating, and after exposure, etching said second additional BCB layer to selectively form vias through said second additional BCB layer at locations corresponding to locations of said conductive interconnects of said respective portion of said circuit geometry associated with said second additional BCB layer; and masking said top surface with a second mask coating, and after exposure, depositing conductive metal on said second additional BCB layer to infill said vias and form said electric traces and conductive interconnects of said respective portion of said circuit geometry associated with said second additional BCB layer.

4. The method as claimed in claim 3, wherein the step of heating the construct to partially cure said second additional BCB layer comprises heating the construct for a time selected to partially cure said second additional BCB layer to about a 60% fully cured state.

5. The method as claimed in claim 1, wherein the step of heating the construct to partially cure said first BCB layer comprises heating the construct for a time selected to partially cure said first BCB layer to about a 60% fully cured state.

6. The method as claimed in claim 1, wherein the step of heating the construct to partially cure said second BCB layer comprises heating the construct for a time selected to partially cure said second BCB layer to about a 60% fully cured state.

7. The method as claimed in claim 1, wherein the step of heating the construct to partially cure said first additional BCB layer comprises heating the construct for a time selected to partially cure said first additional BCB layer to about a 60% fully cured state.

* * * * *